US010217666B2

(12) United States Patent
Miura et al.

(10) Patent No.: US 10,217,666 B2
(45) Date of Patent: Feb. 26, 2019

(54) STACKED STRUCTURE HAVING A PROTECTIVE LAYER BETWEEN AN INSULATION LAYER AND WIRING

(71) Applicant: Sony Corporation, Tokyo (JP)

(72) Inventors: Toshihiro Miura, Kanagawa (JP); Tomohide Naka, Kanagawa (JP); Toshiaki Hasegawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 14/220,791

(22) Filed: Mar. 20, 2014

(65) Prior Publication Data

US 2014/0291857 A1 Oct. 2, 2014

(30) Foreign Application Priority Data

Mar. 29, 2013 (JP) ................................. 2013-070850
Sep. 18, 2013 (JP) ................................. 2013-193060

(51) Int. Cl.
*H01L 21/768* (2006.01)
*H01L 23/532* (2006.01)
*H01L 23/48* (2006.01)
*H01L 23/522* (2006.01)
(Continued)

(52) U.S. Cl.
CPC ...... *H01L 21/76898* (2013.01); *H01L 23/481* (2013.01); *H01L 23/53295* (2013.01); *H01L 23/5226* (2013.01); *H01L 23/552* (2013.01); *H01L 33/44* (2013.01); *H01L 2924/0002* (2013.01)

(58) Field of Classification Search
CPC . H01L 2225/06503; H01L 2225/06541; H01L 2225/06548; H01L 2225/06558; H01L 2225/1011; H01L 2225/1017; H01L 2225/1023; H01L 25/0657; H01L 25/0756; H01L 25/117; H01L 23/48; H01L 23/52; H01L 23/5226; H01L 23/481; H01L 27/14623; H01L 27/14634; H01L 21/76898; H01L 27/14636; H01L 27/1469; H01L 27/14689; H01L 21/823475; H01L 23/5329; H01L 23/52395; H01L 21/4846
See application file for complete search history.

(56) References Cited

U.S. PATENT DOCUMENTS 5,256,562 A * 10/1993 Vu .................... A61B 3/113
257/E21.614
5,282,925 A * 2/1994 Jeng .................. H01L 21/67069
134/31
(Continued)

FOREIGN PATENT DOCUMENTS

JP 2012-028557 2/2012

*Primary Examiner* — Jose R Diaz
(74) *Attorney, Agent, or Firm* — Chip Law Group

(57) ABSTRACT

A stacked structure, includes: a wiring; an insulating layer; a substrate; and a protective layer, wherein the wiring, the insulating layer, and the substrate are stacked from a bottom side, and an end portion of the wiring is projected from a side face of the stacked structure, and the protective layer is provided between the insulating layer and at least a part of the wiring and is configured of a material different from a material configuring the insulating layer.

10 Claims, 19 Drawing Sheets

(51) Int. Cl.
*H01L 23/552* (2006.01)
*H01L 33/44* (2010.01)

(56) References Cited

U.S. PATENT DOCUMENTS

| | | | | |
|---|---|---|---|---|
| 6,093,577 | A * | 7/2000 | van der Groen | ... G02F 1/13454 257/E21.122 |
| 7,528,494 | B2 * | 5/2009 | Furukawa | ......... H01L 21/76898 257/777 |
| 7,892,963 | B2 * | 2/2011 | Yeo et al. | ..................... 438/622 |
| 8,158,515 | B2 * | 4/2012 | Farooq | .............. H01L 21/76898 257/E21.585 |
| 8,816,501 | B2 * | 8/2014 | Gan | ........................ H01L 23/52 257/751 |
| 9,190,316 | B2 * | 11/2015 | Brink | ................ H01L 21/76802 |
| 2011/0233702 | A1 * | 9/2011 | Takahashi | ......... H01L 21/76898 257/432 |

* cited by examiner

STACKED STRUCTURE HAVING A PROTECTIVE LAYER BETWEEN AN INSULATION LAYER AND WIRING

CROSS REFERENCE TO RELATED APPLICATIONS

This application claims the benefit of Japanese Priority Patent Application JP 2013-070850 filed Mar. 29, 2013, and Japanese Priority Patent Application JP 2013-193060 filed Sep. 18, 2013, the entire contents of which are incorporated herein by reference.

BACKGROUND

The present disclosure relates to a stacked structure and a method of manufacturing the stacked structure.

For example, in a backend process of manufacturing of a drive micro-semiconductor unit for driving a light emitting element, a large number of semiconductor units, which are each a type of stacked structure, configured of a transistor, a wiring, and the like, may be fabricated in a silicon semiconductor substrate, and then are separated into individual stacked structures. An isolation trench (a trench section) may be formed between the adjacent stacked structures in order to separate the stacked structures. Furthermore, while depending on application fields of the stacked structure, each stacked structure may be formed such that a wiring as a connection terminal section is exposed in the isolation trench during formation of the isolation trench. The isolation trench is typically formed through etching of an oxide film formed in the stacked structure.

In a known method of manufacturing a semiconductor unit, for example, as disclosed from Japanese Unexamined Patent Application Publication No. 2012-028557, a transistor, a wiring, and the like are provided on a surface of a semiconductor substrate, and a bump is provided on a back of the semiconductor substrate, and the wiring is connected to the bump by a connection section running through the semiconductor substrate. Such a connection section is referred to as through chip via (TCV).

SUMMARY

While the oxide film is etched during formation of the isolation trench, the wiring as the connection terminal section exposed in the isolation trench is concurrently etched, leading to disadvantageous reduction in reliability of the connection terminal section. A substrate having a first wiring thereon is bonded to a base having a second wiring thereon while the first wiring and the second wiring are separated from each other in an opposed manner. Subsequently, the through chip via formation technique is used to connect the first wiring to the second wiring, and therethrough the substrate is etched and an opening is formed up to the second wiring. This may cause the first wiring to be etched, leading to disadvantageous reduction in reliability of connection between the first and second wirings.

It is desirable to provide a stacked structure and a method of manufacturing the stacked structure, the stacked structure having a configuration or a structure by which isolation trenches (trench sections), which are to separate from one another a plurality of stacked structures such as, for example, semiconductor units provided on a substrate, are formed with less reduction in reliability of a connection terminal section exposed in each isolation trench. It is further desirable to provide a stacked structure and a method of manufacturing the stacked structure, the stacked structure having a configuration or a structure by which when a substrate having a first wiring thereon is bonded to a base having a second wiring thereon while the first wiring and the second wiring are separated from each other in an opposed manner, and when the through chip via formation technique is then used to connect the first wiring to the second wiring, reliability of connection between the first and second wirings is less reduced.

According to an embodiment of the present disclosure, there is provided a stacked structure, including: a wiring; an insulating layer; a substrate; and a protective layer, wherein the wiring, the insulating layer, and the substrate are stacked from a bottom side, and an end portion of the wiring is projected from a side face of the stacked structure, and the protective layer is provided between the insulating layer and at least a part of the wiring and is configured of a material different from a material configuring the insulating layer.

According to an embodiment of the present disclosure, there is provided a stacked structure, including: a substrate having thereon an insulating layer and a first wiring, the first wiring being provided on the insulating layer; a base having a second wiring thereon; an opening provided through the substrate and the insulating layer; and a protective layer provided between the insulating layer and at least a part of the first wiring, the protective layer being configured of a material different from a material configuring the insulating layer, wherein the substrate is bonded to the base while the first wiring and the second wiring are separated from each other in an opposed manner, and at least an end face of the first wiring and part of the second wiring are exposed in the opening, and the opening is filled with a conductive material.

According to an embodiment of the present disclosure, there is provided a method of manufacturing a stacked structure, the method including: (A) forming an insulating layer on a substrate, and forming a protective layer configured of a material different from a material configuring the insulating layer on part or all of a region, in which at least a wiring is to be formed, of the insulating layer, and then forming the wiring having an end portion; (B) bonding a side having the wiring of the substrate to a support substrate; (C) thinning the substrate; (D) etching the substrate and the insulating layer to form a trench section in which the end portion of the wiring having a surface covered with the protective layer is exposed; and (E) removing the protective layer exposed in the trench section to expose the end portion of the wiring.

According to an embodiment of the present disclosure, there is provided a method of manufacturing a stacked structure, the method including: preparing a base having a second wiring thereon; (A) forming an insulating layer on a substrate, and forming a protective layer configured of a material different from a material configuring the insulating layer on part or all of a region, in which at least a first wiring is to be formed, of the insulating layer, and then forming the first wiring having an end face; (B) bonding the substrate to the base while the first wiring and the second wiring are separated from each other in an opposed manner; (C) thinning the substrate; (D) etching the substrate and the insulating layer to form an opening in which part of the second wiring and at least the end face of the first wiring are exposed; and (E) filling the opening with a conductive material.

In the stacked structure or the method of manufacturing the stacked structure according to the embodiments of the present disclosure, when the trench section (isolation trench)

is formed, since the protective layer configured of a material different from a material configuring the insulating layer covers part or all of the wiring, occurrence of damage to the wiring is prevented, and reduction in reliability of a connection terminal section is advantageously suppressed. In the stacked structure or the method of manufacturing the stacked structure according to the embodiments of the present disclosure, when the through chip via is formed, since the protective layer configured of a material different from a material configuring the insulating layer is provided between the insulating layer and the first wiring, occurrence of damage to the first wiring is prevented, and reduction in reliability of connection between the first and second wirings is advantageously suppressed. It is to be noted that the effects described herein are merely for the purposes of illustration and not limitation, and additional effects are also acceptable.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1A:
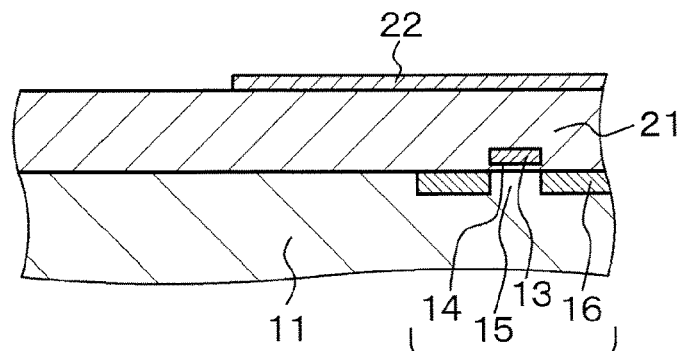
FIGS. 1A, 1B, 1C, and 1D are each schematic partial end-face diagram of a substrate and the like for explaining a method of manufacturing a stacked structure of Example 1.

Although the present disclosure is now described in detail based on Examples with reference to the accompanying drawings, the disclosure is not limited to such Examples, and various numeral values and materials in the Examples are merely for the purposes of illustration.

It is to be noted that the description is made in the following order.

1. Stacked structure according to each of first and second embodiments of the present disclosure and method of manufacturing the stacked structure, and general description.

2. Example 1 (Stacked structure according to first embodiment of the present disclosure and method of manufacturing the stacked structure).

3. Example 2 (Modification of Example 1).

4. Example 3 (Another Modification of Example 1).

5. Example 4 (Another Modification of Example 1).

6. Example 5 (Another Modification of Example 1).

7. Example 6 (Modification of Example 5).

8. Example 7 (Stacked structure according to second embodiment of the present disclosure and method of manufacturing the stacked structure), and others.

[Stacked Structure According to Each of First and Second Embodiments of the Present Disclosure and Method of Manufacturing the Stacked Structure, and General Description]

A stacked structure according to each of first and second embodiments of the present disclosure, or a method of manufacturing the stacked structure according to each of the first and second embodiments of the present disclosure is preferably made in a mode where a material configuring a protective layer is less likely to be etched than a material configuring an insulating layer. When an etching rate of the insulating layer is defined to be "1", an etching rate of the protective layer is preferably, but not limitedly, "0.1" or less.

The method of manufacturing the stacked structure according to the first embodiment of the present disclosure including the above-described preferable mode may be in a configuration where (A) contains forming an interlayer insulating layer between the adjacent wirings. In the configuration, the wirings having the end portions are formed on the protective layer, and then the interlayer insulating layer is formed on a portion of the protective layer between the adjacent wirings. Alternatively, the interlayer insulating layers are formed on the protective layer, and then the wiring having the end portion is formed on a portion of the protective layer between the adjacent interlayer insulating layers. The method of manufacturing the stacked structure according to the second embodiment of the present disclosure including the above-described preferable mode may be in a configuration where (A) contains forming an interlayer insulating layer between the first wirings adjacent to each other. In the configuration, the first wiring having the end face is formed on the protective layer, and then the interlayer insulating layer is formed on a portion of the protective layer between the first wirings adjacent to each other. Alternatively, the interlayer insulating layer is formed on the protective layer, and then the first wiring having the end face is formed on a portion of the protective layer between the adjacent interlayer insulating layers.

Alternatively, the method of manufacturing the stacked structure according to the first embodiment of the present disclosure including the above-described preferable mode may be in a configuration where, in (A), a concave portion is formed in a region of the insulating layer, in which the wiring is to be formed, and then the protective layer configured of a material different from a material configuring the insulating layer is formed on each of a side face and a bottom face of the concave portion, and then the wiring is formed in the concave portion. The method of manufacturing the stacked structure according to the second embodiment of the present disclosure including the above-described preferable mode may be in a configuration where, in (A), a concave portion is formed in a region of the insulating layer, in which the first wiring is to be formed, and then the protective layer configured of a material different from a material configuring the insulating layer is formed on each of a side face and a bottom face of the concave portion, and then the first wiring is formed in the concave portion.

Furthermore, the method of manufacturing the stacked structure according to the first embodiment of the present disclosure including the above-described preferable mode or configuration may be in a mode where, in (D), a connection section of the substrate and the support substrate is etched during formation of the trench section, and part of the support substrate may be further etched. Alternatively, the method may be in a mode where a side having the wiring of the substrate is bonded to the support substrate with an adhesive layer in (B). In this case, the method may be in a mode where part of the adhesive layer is etched during formation of the trench section in (D). The method of manufacturing the stacked structure according to the second embodiment of the present disclosure including the above-described preferable mode or configuration may be in a mode where a connection section of the substrate and the base is etched during formation of the opening in (D), or the substrate is bonded to the base with an adhesive layer in (B).

In this case, the method may be in a mode where part of the adhesive layer is etched during formation of the opening in (D).

Furthermore, the method of manufacturing the stacked structure according to the first embodiment of the present disclosure including the above-described preferable mode or configuration may be in a mode where part of the adhesive layer located below the wiring is etched during formation of the trench section in (D), and a second insulating layer is formed on the substrate and in the trench section, between (D) and (E). In this case, the method may be in a mode where the second insulating layer is formed on the substrate and in the trench section, and then a light-shielding film is formed on the second insulating layer on at least a sidewall of the trench section. Alternatively, the light-shielding film may be formed on a portion of the second insulating layer on each of the sidewall of the trench section and the substrate. Alternatively, in such a case, after the light-shielding film is formed, a third insulating layer may be further formed on the light-shielding film (in some cases, on each of the light-shielding film and the second insulating layer). In (D), part of the adhesive layer located below the wiring is etched during formation of the trench section. A discontinuous portion is therefore formed in at least the second insulating layer. As a result, the support substrate is allowed to be finally easily removed from the substrate, positioning accuracy of the stacked structure is less reduced after removing the support substrate, and the stacked structure is allowed to be accurately disposed on a mounting substrate described later.

The stacked structure according to any of the first and second embodiments of the present disclosure including the above-described preferable mode or configuration, or a stacked structure given by the method of manufacturing the stacked structure may be in a mode where the substrate is configured of a semiconductor substrate, an element (specifically, for example, a transistor) is provided in the substrate, and a connection section, which connects the element to the wiring (or the first wiring), is provided in the insulating layer. When the element is configured of a transistor, specific examples of the stacked structure may include a micro-semiconductor unit having a side 60 µm to 150 µm both inclusive in length.

Furthermore, the stacked structure according to the first embodiment of the present disclosure including the above-described preferable mode or configuration, or a stacked structure given by the method of manufacturing the stacked structure may be in a configuration where the protective layer is provided between the insulating layer and at least a part of the wiring, and between at least a part of the wiring and a part of the wiring. In this case, the interlayer insulating layer may be provided between the adjacent wirings, and the protective layer is provided between the interlayer insulating layer and the insulating layer. Furthermore, an end face of an end portion of the wiring may be covered with the interlayer insulating layer. The stacked structure according to the second embodiment of the present disclosure including the above-described preferable mode or configuration, or a stacked structure given by the method of manufacturing the stacked structure may be in a configuration where the protective layer is provided between the insulating layer and at least a part of the first wiring, and between at least a part of the first wiring and a part of the first wiring. In this case, the interlayer insulating layer may be provided in a region between the protective layer and the insulating layer and between the first wirings adjacent to each other, and the protective layer is provided between the interlayer insulating layer and the insulating layer. It is to be noted that "a part of the wiring" and "a part of the first wiring" in the above description specifically refer to a portion of the wiring located in the neighborhood of the side face of the stacked structure and a portion of the first wiring located in the neighborhood of the opening, respectively.

Furthermore, the stacked structure according to the first embodiment of the present disclosure including the above-described preferable mode or configuration, or a stacked structure given by the method of manufacturing the stacked structure may be in a mode where the protective layer is provided on part or all of a top face of a portion of the wiring located below the insulating layer. Alternatively, the protective layer may be provided on the top face of the portion of the wiring located below the insulating layer. In this case, the protective layer may be provided from the top face to a side face of the portion of the wiring located below the insulating layer. In some cases, the end face of the end portion of the wiring may be covered with the protective layer. The stacked structure according to the second embodiment of the present disclosure including the above-described preferable mode or configuration, or a stacked structure given by the method of manufacturing the stacked structure may be in a mode where the protective layer is provided on part or all of a top face of a portion of the first wiring located below the insulating layer. Alternatively, the protective layer may be provided on the top face of the portion of the first wiring located below the insulating layer. In this case, the protective layer may be provided from the top face to a side face of the portion of the first wiring located below the insulating layer.

Furthermore, the stacked structure according to the first embodiment of the present disclosure including the above-described preferable mode or configuration, or the method of manufacturing the stacked structure may be in a mode where the end portion of the wiring serves as a connection terminal section.

Furthermore, the stacked structure according to the first embodiment of the present disclosure including the above-described preferable mode or configuration, or a stacked structure given by the method of manufacturing the stacked structure may be in a mode where the second insulating layer is provided on at least a side face of the stacked structure. In this case, the second insulating layer may also be provided on a top face of the stacked structure. Furthermore, the second insulating layer may extend to part of a lower surface of the stacked structure. Alternatively, the adhesive layer may be provided on the lower surface of the stacked structure, and the second insulating layer may extend to part of the adhesive layer. In such cases, the light-shielding film may be provided on the second insulating layer, or the third insulating layer may be further provided on the light-shielding film (in some cases, on each of the light-shielding film and the second insulating layer).

Hereinafter, the stacked structure according to the first embodiment of the present disclosure including the above-described preferable mode or configuration, or the method of manufacturing the stacked structure may be generally referred to as simply "first embodiment of the present disclosure". In addition, the stacked structure according to the second embodiment of the present disclosure including the above-described preferable mode or configuration, or the method of manufacturing the stacked structure may be generally referred to as simply "second embodiment of the present disclosure".

In the first embodiment of the present disclosure, the wiring and the connection section that connects the element to the wiring may be configured of a known conductive material. Examples of the conductive material may include copper (Cu), aluminum (Al), and alloys thereof. Similarly, in the second embodiment of the present disclosure, the first wiring, the second wiring, and the connection section may be configured of a known conductive material. Examples of the conductive material may include copper (Cu), aluminum (Al), and alloys thereof. A conductive material for filling of the opening may be configured of a known conductive material. A method of forming the connection section that connects the element to the wiring, or a method of filling the opening with the conductive material includes a physical vapor deposition process (PVD process) such as a sputtering process and a chemical vapor deposition process (CVD process) while depending on the conductive materials configuring the connection section or on the conductive materials to be filled in the opening.

Examples of the material configuring the insulating layer, the second insulating layer, the third insulating layer, and the interlayer insulating layer in the first embodiment of the present disclosure, or examples of the material configuring the insulating layer and the interlayer insulating layer in the second embodiment of the present disclosure may include silicon-oxide-based materials, and low-dielectric-constant dielectric materials such as SiOCH, organic SOG, polyimide resin, and fluorine-based resin (for example, fluorocarbon, amorphous tetrafluoroethylene, polyaryl ether, fluoroaryl ether, fluorinated polyimide, perylene, benzocyclobutene, amorphous carbon, cycloperfluorocarbon polymer, and fluorinated fullerene). On the other hand, examples of the material configuring the protective layer may include SiN-based materials containing SiON, SiCH, SiCO, SiCOH, SiCN, SiCNH, SiOCN, SiOCNH, amorphous carbon, various types of resin, polysilicon, and insulative metal compounds (for example, aluminum oxide). In the first embodiment of the present disclosure, examples of materials configuring the light-shielding film may include materials capable of shielding light, such as titanium (Ti), chromium (Cr), tungsten (W), tantalum (Ta), aluminum (Al), and $MoSi_2$. Examples of etching processes of each of the substrate, the insulating layer, and the protective layer may include an RIE process. Examples of methods of decreasing thickness of the substrate may include a process of etching the substrate, a lapping process, and a chemical mechanical polishing process (CMP process).

In the first embodiment of the present disclosure, examples of the substrate may include a silicon semiconductor substrate. Examples of the support substrate may include a glass plate, a metal plate, an alloy plate, a quartz plate, a ceramic plate, and a plastic plate. As described above, the substrate is allowed to be bonded to the support substrate with the adhesive layer. The support substrate is finally removed (separated) from the substrate. Examples of removal (separation) methods may include a laser ablation process, a heating process, and an etching process. In the second embodiment of the present disclosure, examples of the substrate may include a silicon semiconductor substrate. Examples of the base may include a silicon semiconductor substrate and a stacked structure of the second wiring and the insulating film. In addition, the substrate and the base may each have various elements therein.

In a mounting board according to the first embodiment or an electronic device according to the first embodiment, the stacked structure according to the first embodiment of the present disclosure or a stacked structure given by the method of manufacturing the stacked structure is mounted on a mounting substrate. The end portion of the wiring formed in the stacked structure is electrically connected to a wiring section formed in the mounting substrate with, for example, a plating layer. To mount the stacked structure on the mounting substrate, for example, a lower surface of the stacked structure is bonded to the mounting substrate by a photo-curing adhesive material layer.

Alternatively, a mounting board according to the second embodiment or an electronic device according to the second embodiment includes the stacked structure according to the first embodiment of the present disclosure or a stacked structure given by the method of manufacturing the stacked structure, and a mounting substrate having a wiring section thereon, in which a lower surface of the stacked structure is bonded to the mounting substrate with an adhesive material layer, and the end portion of the wiring in the stacked structure is electrically connected to the wiring section provided in the mounting substrate with a plating layer.

Alternatively, an electronic device according to a third embodiment includes the at least one stacked structure according to the first embodiment of the present disclosure or at least one stacked structure given by the method of manufacturing the stacked structure, and a mounting substrate having a wiring section thereon, in which a lower surface of the at least one stacked structure is bonded to the mounting substrate with an adhesive material layer (for example, a photo-curing adhesive material layer), the end portion of the wiring in the at least one stacked structure is electrically connected to the wiring section provided on the mounting substrate with a plating layer, the at least one stacked structure includes a substrate configured of a semiconductor substrate having a first element therein, in which the first element is electrically connected to the wiring with a connection section provided in the insulating layer, at least one second element is disposed on the mounting substrate adjacently to the at least one stacked structure, the first element is electrically connected to the at least one second element with the wiring section provided on the mounting substrate (specifically, for example, with a plating layer), and the at least one second element is driven by the first element.

In manufacture of the electronic device, the stacked structures are separated from one another through formation of the trench sections (isolation trenches), and the support substrate is removed (separated) from the substrate of each stacked structure as described above while the substrate is held by a relay substrate. The stacked structure is disposed on an uncured adhesive material layer provided on the mounting substrate, and then the relay substrate is removed, and then the uncured adhesive material layer is cured, and then the wiring is electrically connected to the wiring section.

Examples of the mounting substrate may include a rigid printed circuit board and a flexible printed circuit board. The wiring section is allowed to be configured of a wiring formed on such a printed circuit board. Alternatively, examples of the mounting substrate may include a glass substrate having a wiring thereon, and a TFT substrate (a substrate having a thin film transistor (TFT) thereon).

The electronic device may be in a mode where the wiring section is connected to a peripheral circuit and/or a power supply. A known peripheral circuit and a known power supply may be used as the peripheral circuit and the power supply, and an appropriate peripheral circuit and an appropriate power supply are selected based on the first element and the second element.

The electronic device according to any of the first to third embodiments may be in a mode where the at least one stacked structure includes a plurality of stacked structures, the at least one second element includes a plurality of second elements, the plurality of stacked structures and the plurality of second elements are arranged in pairs in a two-dimensional matrix manner, the first element is configured of a transistor, and the plurality of second elements are configured of light emitting elements, so that an image display unit is configured.

Alternatively, the electronic device according to any of the first to third embodiments may be in a mode where the at least one stacked structure includes a plurality of stacked structures, the at least one second element includes a plurality of second elements, the first element is configured of a transistor, and the plurality of second elements are configured of sensors, so that a sensor array is configured.

In the electronic device according to any of the first to third embodiments, the number of the elements or the first elements (hereinafter, the element or the first element may be generally referred to as "first element or the like") is one or more while being not limited in upper limit. The stacked structure having the first element or the like may be, for example, a drive micro-semiconductor unit configured to drive the second element such as, for example, a light emitting element or a sensor. One first element or the like may drive one second element, or may drive a plurality of second elements. It is to be noted that the first element or the like is not limited to the transistor. The first element or the like may be configured of a diode, a resistance element, or a capacitor element (capacitive element), or may be configured of one or more types of components selected from the transistor, the diode, the resistance element, and the capacitor element. Alternatively, the first element or the like and the second element may each be configured of a so-called passive element. In the stacked structure, the first element or the like is provided in the substrate. Specifically, the first element or the like may be provided within the substrate, may be provided on a surface of the substrate, or may be provided between the substrate and the insulating layer. However, the first element or the like may not be necessarily provided in the substrate. For example, the stacked structure including only the wiring may be used as a type of switcher or divider.

When the second element is configured of a light emitting element, the light emitting element may be specifically configured of a light emitting diode (LED). The light emitting diode may be a light emitting diode having a known configuration and a known structure. Specifically, a light emitting diode having an optimum configuration and an optimum structure is fabricated from an appropriate material depending on a light emitting color of the light emitting diode. In an image display unit having a light emitting diode as a light emitting section, a light emitting section configured of a red light emitting diode serves as a red light emitting sub-pixel, a light emitting section configured of a green light emitting diode serves as a green light emitting sub-pixel, and a light emitting section configured of a blue light emitting diode serves as a blue light emitting sub-pixel. Such three types of sub-pixels configure one pixel, and a color image is shown based on a light emitting state of each of the three types of sub-pixels. When the three types of sub-pixels configure one pixel, examples of arrangements of the three types of sub-pixels include a delta arrangement, a stripe arrangement, a diagonal arrangement, and a rectangle arrangement. The light emitting diode is driven with constant current based on a PWM drive method. Alternatively, the image display unit may be applied to a projector having three panels, in which a first panel is configured of a light emitting section including a red light emitting diode, a second panel is configured of a light emitting section including a green light emitting diode, and a third panel is configured of a light emitting section including a blue light emitting diode, and such colors of light from three panels are collected using, for example, a dichroic prism.

When the second element is configured of a sensor, examples of the sensor may include a sensor configured to detect visible light, a sensor configured to detect infrared rays, a sensor configured to detect ultraviolet rays, a sensor configured to detect X-rays, a sensor configured to detect atmospheric pressure, a sensor configured to detect temperature, a sensor configured to detect sound, a sensor configured to detect vibration, a sensor configured to detect acceleration, and a sensor configured to detect angular acceleration (so-called gyro sensor).

For example, the plating layer may be formed by an electroplating process, specifically, for example, an electrolytic copper plating process. The end portion of the wiring is preferably separated from the wiring section at start of plating. When a voltage is applied between a plating bath and the wiring section that is used as a cathode, the plating layer begins to grow from the wiring section. Since a leading end face of growth of the plating layer is often rounded, the plating layer first comes into contact with the end portion of the wiring at a point-like portion or at an extremely limited area. When the plating layer comes into contact with the end portion of the wiring, the plating layer grows from both the wiring section and the end portion of the wiring, and the contact surface is gradually expanded. In this way, the plating layer is expanded from a certain narrow range; hence, a void is less likely to be formed in the plating layer, making it possible to form continuous grains having a uniform composition. As a result, electrically and mechanically strong bonding is allowed to be achieved compared with a case of starting plating while the wiring section is in contact with the end portion of the wiring.

Example 1

Figure 6A:
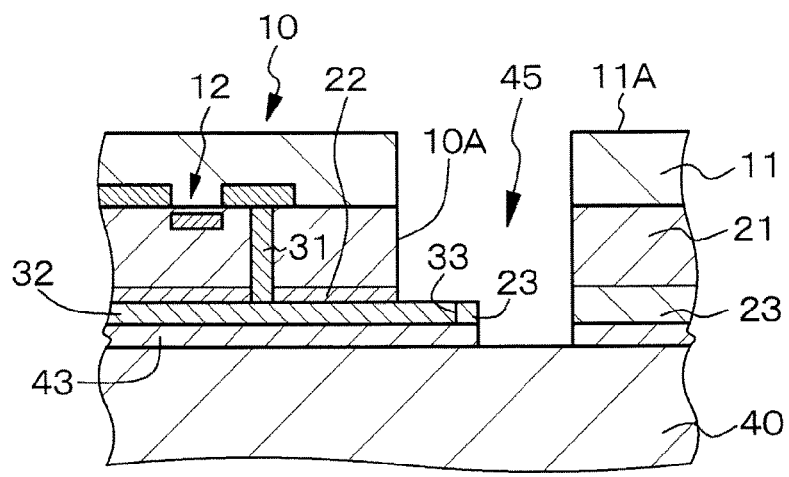
FIGS. 6A and 6B are each a schematic partial end-face diagram of the substrate and the like following FIG. 5A for explaining the method of manufacturing the stacked structure of Example 1.

Example 1 relates to a stacked structure according to the first embodiment of the present disclosure and a method of manufacturing the stacked structure. FIG. 6A illustrates a schematic partial end-face diagram of the stacked structure, specifically a semiconductor unit, of Example 1.

The stacked structure of Example 1 is a stacked structure 10 including a wiring 32, an insulating layer 21, and a substrate 11 that are stacked from a bottom side. An end portion of the wiring 32 is projected from a side face 10A of the stacked structure 10, and a protective layer 22 configured of a material different from a material configuring the insulating layer 21 is provided between the insulating layer 21 and at least a part of the wiring 32.

In the stacked structure 10 of Example 1, the substrate 11 is configured of a semiconductor substrate (more specifically, a silicon semiconductor substrate), and has an element (more specifically, a transistor) 12 therein. A connection section 31 connecting the element 12 to the wiring 32 is provided in the insulating layer 21. The connection section 31 is provided through the insulating layer 21 and the protective layer 22.

The protective layer 22 is provided between the insulating layer 21 and at least a part of the wiring 32, and between at least a part of the wiring 32 and a part of the wiring 32. Specifically, in Example 1, the protective layer 22 is provided between the insulating layer 21 and the wiring 32, and between the adjacent wirings 32. An interlayer insulating layer 23 is provided between the adjacent wirings 32. The protective layer 22 is provided between the interlayer insulating layer 23 and the insulating layer 21. An end face 33 of the end portion of the wiring 32 projected from a side face 10A of the stacked structure 10 is covered with the interlayer insulating layer 23. Such a mode, however, is not limitative, and the end face 33 of the wiring 32 projected from the side face 10A of the stacked structure 10 may be exposed. The portion of the wiring 32 projected from the side face 10A of the stacked structure 10 corresponds to a connection terminal section.

A material configuring the protective layer 22 is less likely to be etched than a material configuring the insulating layer 21. Specifically, the insulating layer 21 and the interlayer insulating layer 23 may each be configured of a silicon-oxide-based material, more specifically $SiO_2$. The protective layer 22 may be configured of a SiN-based material, more specifically SiN. For example, the wiring 32 and the connection section 31 may be configured of copper (Cu).

Figure 1B:
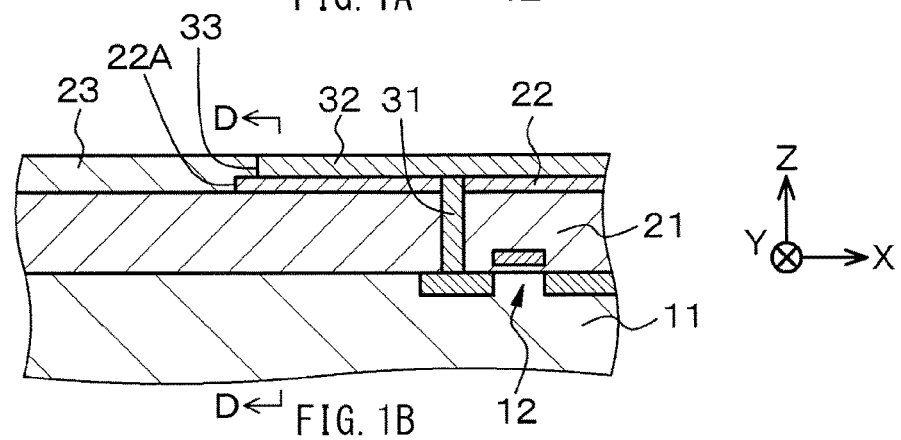
Figure 1C:
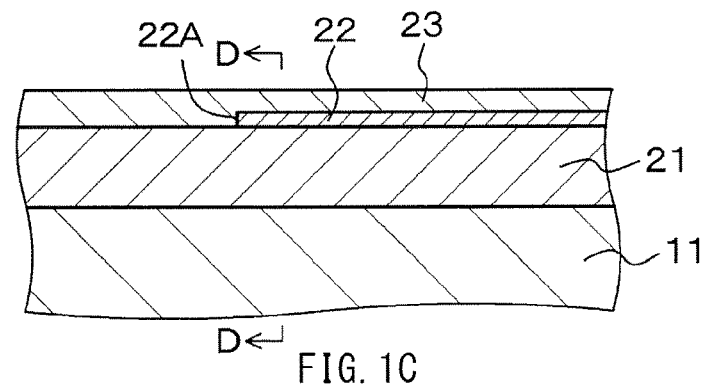
Figure 1D:
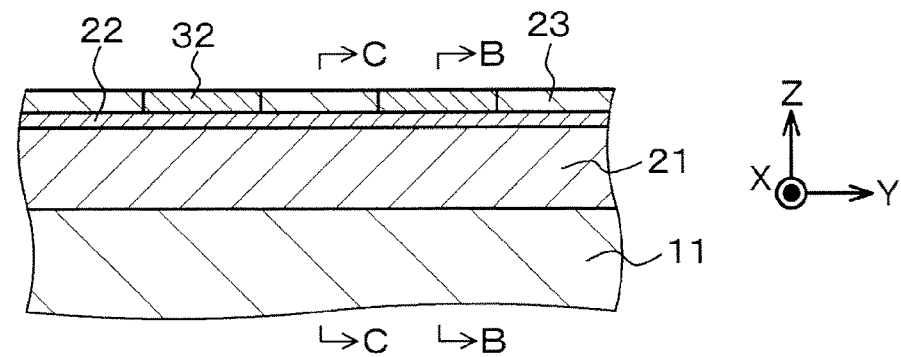

A method of manufacturing the stacked structure of Example 1 is now described with reference to drawings. FIGS. 1A and 1B, FIGS. 2A and 2C, FIG. 3A, FIG. 4A, FIG. 5A, and FIGS. 6A and 6B are each a schematic partial end-face diagram of a substrate and the like for explaining the method of manufacturing the stacked structure of Example 1 (a schematic partial end-face diagram along an XZ plane illustrated in FIG. 1B or along an arrow B-B illustrated in FIG. 1D). FIG. 1C, FIG. 2B, FIG. 3B, FIG. 4B, and FIG. 5B are each a schematic partial end-face diagram of the substrate and the like that are cut along a virtual vertical plane different from that in FIG. 1B, FIG. 2A, FIG. 3A, FIG. 4A, and FIG. 5A, respectively, (a plane parallel to the XZ plane or a plane along an arrow C-C illustrated in FIG. 1D). Furthermore, FIG. 1D is a schematic partial end-face diagram of the substrate and the like that are cut along a virtual vertical plane different from that in each of FIGS. 1B and 1C (a YZ plane illustrated in FIG. 1D or a plane along an arrow D-D illustrated in FIGS. 1B and 1C).

First, the insulating layer 21 is formed on the substrate 11, and the protective layer 22 configured of a material different from a material configuring the insulating layer 21 is formed on part or all of a region of the insulating layer 21, in which at least the wiring 32 is to be formed, and then the wiring 32 having the end portion is formed.

[Step-100]

Specifically, first, an element (specifically, a transistor, and more specifically, a field effect transistor, FET) 12 is formed based on a known process on the substrate 11 configured of a silicon semiconductor substrate. It is to be noted that reference numerals 13, 14, 15, and 16 represent a gate electrode, a gate insulating layer, a channel formation region, and a source/drain region, respectively. Subsequently, the insulating layer 21 configured of $SiO_2$ is formed by a known CVD process on the substrate 11 having the element 12 therein. Subsequently, the protective layer 22 configured of a material (specifically, SiN) different from a material configuring the insulating layer 21 is formed on the insulating layer 21 (specifically, in Example 1, on a region of the insulating layer 21, in which the wiring 32 is to be formed, and on a region containing a region of the insulating layer 21 located between the adjacent wirings 32) (see FIG. 1A).

[Step-110]

Subsequently, the wirings 32 each having an end portion are formed on the protective layer 22. In addition, the interlayer insulating layer 23 is formed between the adjacent wirings 32, and the connection section 31 that is to connect the element 12 to the wiring 32 is formed through the insulating layer 21 and the protective layer 22. Specifically, the interlayer insulating layer 23 is formed based on a CVD process on the protective layer 22. A concave portion (trench) is formed in a portion of the interlayer insulating layer 23, in which the wiring 32 is to be formed. Furthermore, a hole that runs up to the source/drain region 16 of the element 12 is formed in a portion of each of the insulating layer 21 and the protective layer 22, in which the connection section 31 is to be formed. The hole and the concave portion (trench) may be filled with a copper layer based on, for example, a plating process. In this way, the wiring 32 having the end face 33 and the connection section 31 are produced based on a so-called dual damascene process (see, FIGS. 1B, 1C, and 1D). However, the method of forming each of the wiring 32, the connection section 31, and the protective layer 22 is not limited to such a method. In this way, the interlayer insulating layer 23 may be formed before formation of the wiring 32 and the like. Alternatively, the interlayer insulating layer 23 may be formed after formation of the wiring 32 and the like. An end face 22A of the protective layer 22 is projected from the end face 33 of the wiring 32.

[Step-120]

Subsequently, a side having the wiring 32 of the substrate 11 is bonded to a support substrate 40 configured of a quartz substrate. Specifically, the substrate 11 is bonded to the support substrate 40 with the wiring 32 and the interlayer insulating layer 23 in between. More specifically, the substrate 11 is bonded to the support substrate 40 with an adhesive layer 43 by a known process (see FIGS. 2A and 2B).

[Step-130]

Figure 2A:
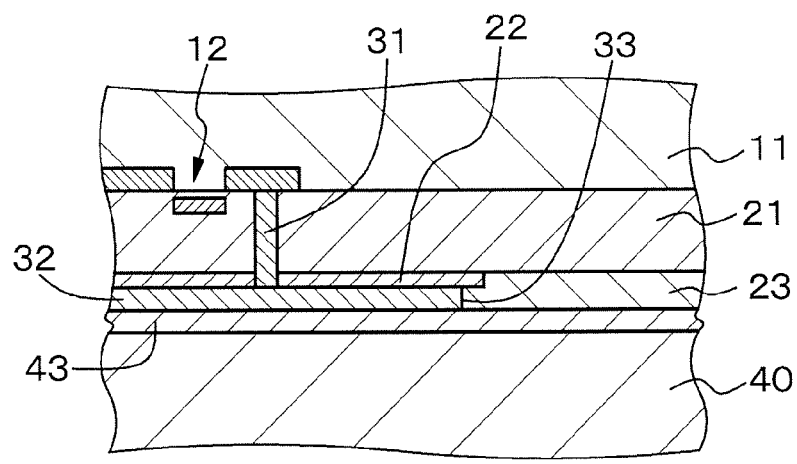
FIGS. 2A and 2C are each a schematic partial end-face diagram of the substrate and the like following FIG. 1B for explaining the method of manufacturing the stacked structure of Example 1.
Figure 2B:
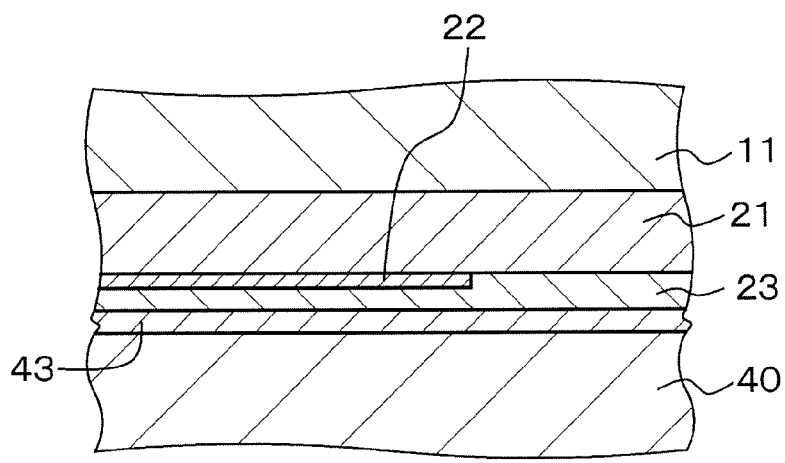
FIG. 2B is a schematic partial end-face diagram of the substrate and the like that are cut along a virtual vertical plane different from that in FIG. 2A.
Figure 2C:
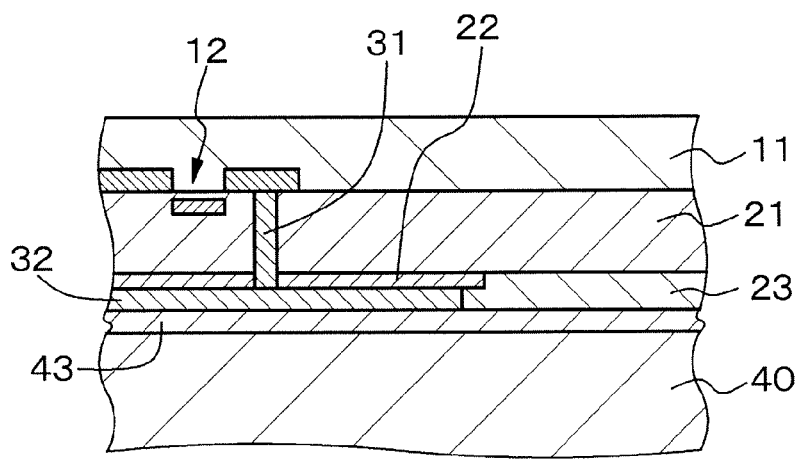
Figure 3A:
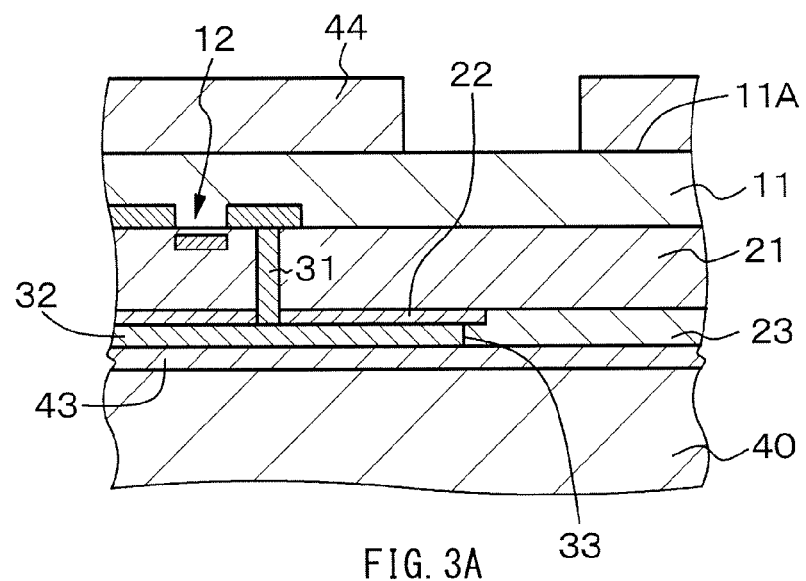
FIGS. 3A and 3B are each a schematic partial end-face diagram of the substrate and the like following FIGS. 2C and 2B, respectively for explaining the method of manufacturing the stacked structure of Example 1.
Figure 3B:
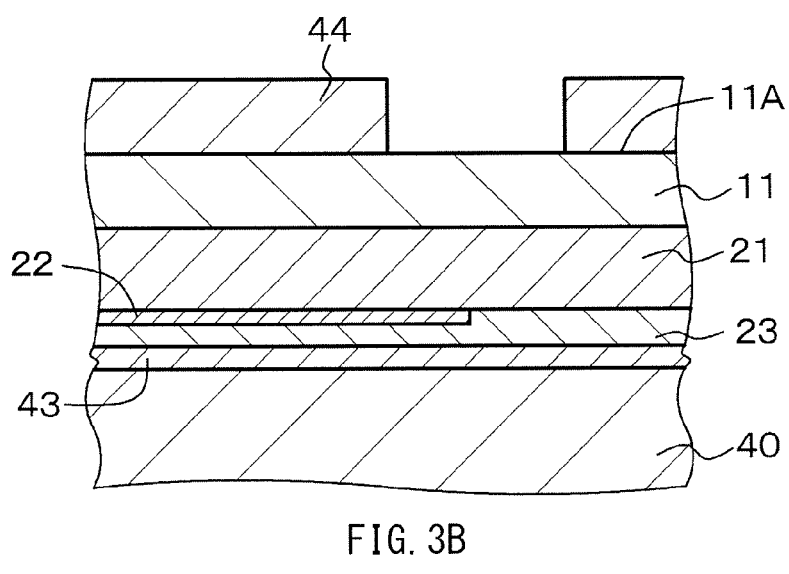

Subsequently, thickness of the substrate 11 may be decreased to, for example, about 10 μm by, for example, a CMP process (see FIG. 2C).

[Step-140]

Figure 4A:
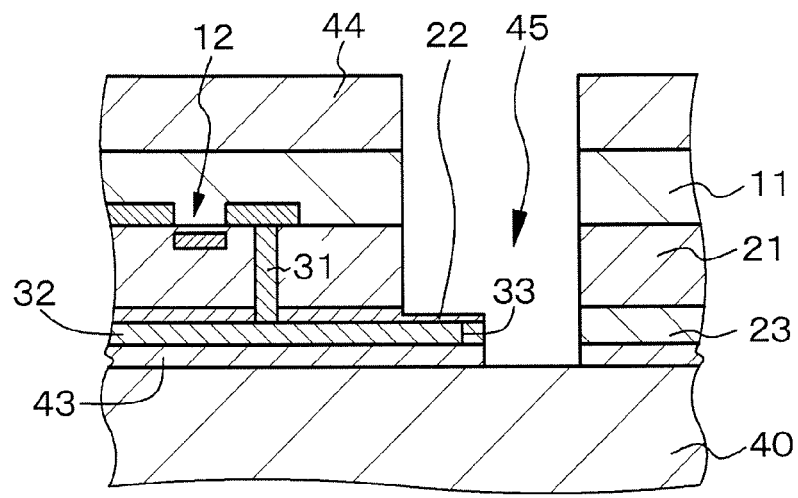
FIGS. 4A and 4B are each a schematic partial end-face diagram of the substrate and the like following FIGS. 3A and 3B, respectively, for explaining the method of manufacturing the stacked structure of Example 1.
Figure 4B:
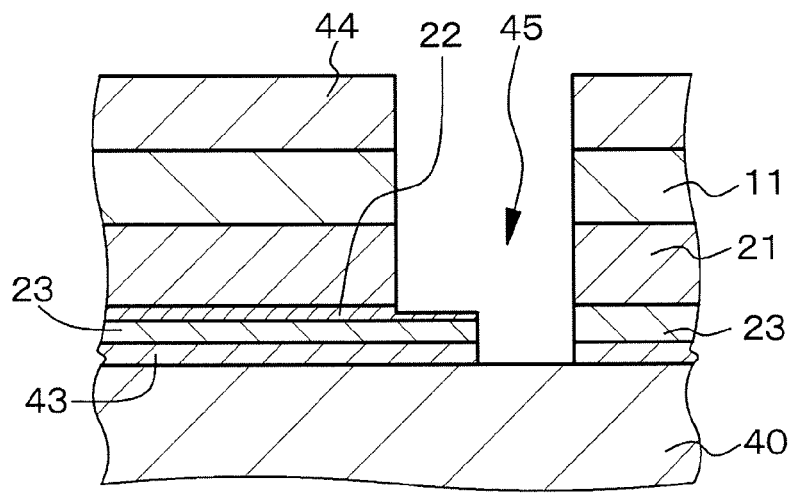
Figure 5A:
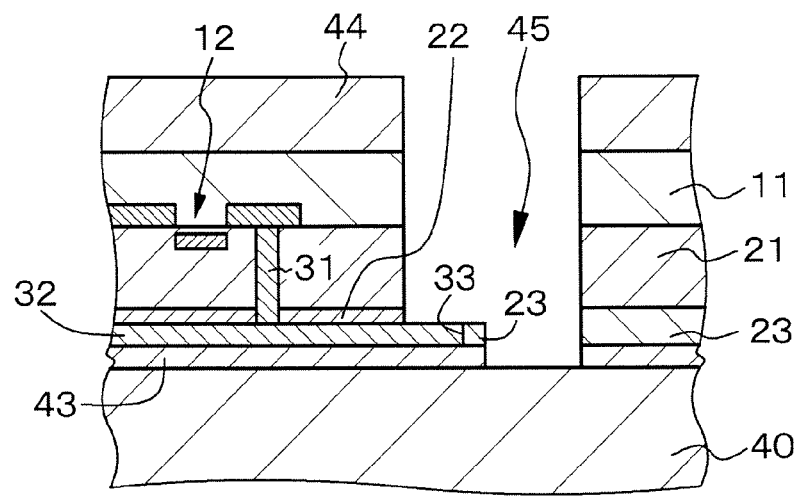
FIGS. 5A and 5B are each a schematic partial end-face diagram of the substrate and the like following FIGS. 4A and 4B, respectively, for explaining the method of manufacturing the stacked structure of Example 1.
Figure 5B:
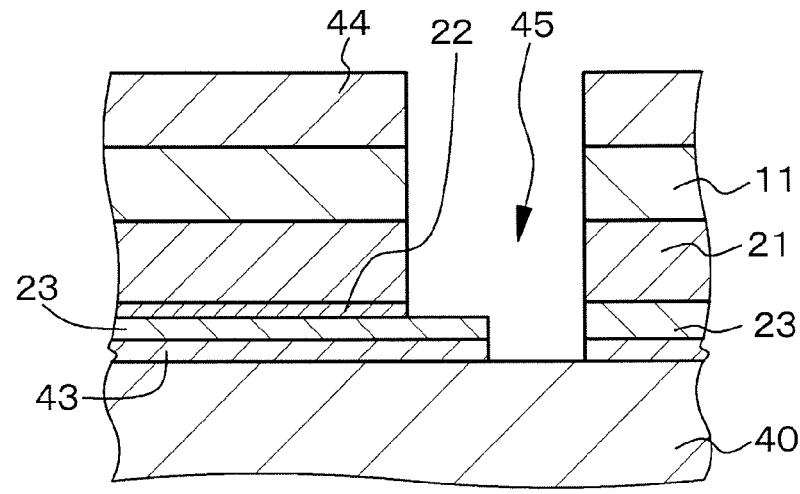

Subsequently, the substrate 11 and the insulating layer 21 are etched to form a trench section 45 in which the end portion of the wiring 32 having a surface covered with the protective layer 22 is exposed. Specifically, the substrate 11 and the insulating layer 21 are etched. More specifically, a layer of an etching resist 44 is formed by a known process on a top face 11A of the substrate 11 (see FIGS. 3A and 3B). Subsequently, the substrate 11, the insulating layer 21, and the interlayer insulating layer 23 are etched (see FIGS. 4A and 4B). At this time, an etching condition is selected such that the insulating layer 21 and the interlayer insulating layer 23 are etched while the protective layer 22 is not etched. Thus, a trench section (an isolation trench) 45 is formed, in which a part of the wiring 32 having a surface covered with the protective layer 22 is exposed. The part of the wiring 32 exposed in the trench section 45 serves as a connection terminal section. As illustrated in FIGS. 4A and 4B, the protective layer 22 may be slightly etched during etching of the insulating layer 21 and the interlayer insulating layer 23. However, the wiring 32 is covered with the protective layer 22, preventing occurrence of damage, etc. to the wiring 32. A connection section of the substrate 11 and the support substrate 40 is etched during formation of the trench section 45. Specifically, a part of the adhesive layer 43 as the connection section of the substrate 11 and the support substrate 40 is etched.

[Step-150]

Subsequently, the protective layer 22 exposed in the trench section 45 is removed to expose the end portion of the wiring 32. Specifically, an etching condition is varied so that the protective layer 22 exposed in the trench section (isolation trench) 45 is removed to expose a surface of the part of the wiring 32 (see FIGS. 5A and 5B). Subsequently, the etching resist 44 is removed, thereby the stacked structure (semiconductor unit) of Example 1 having a structure illustrated in FIG. 6A is produced. The individual stacked structures are separated from one another.

[Step-160]

Figure 6B:
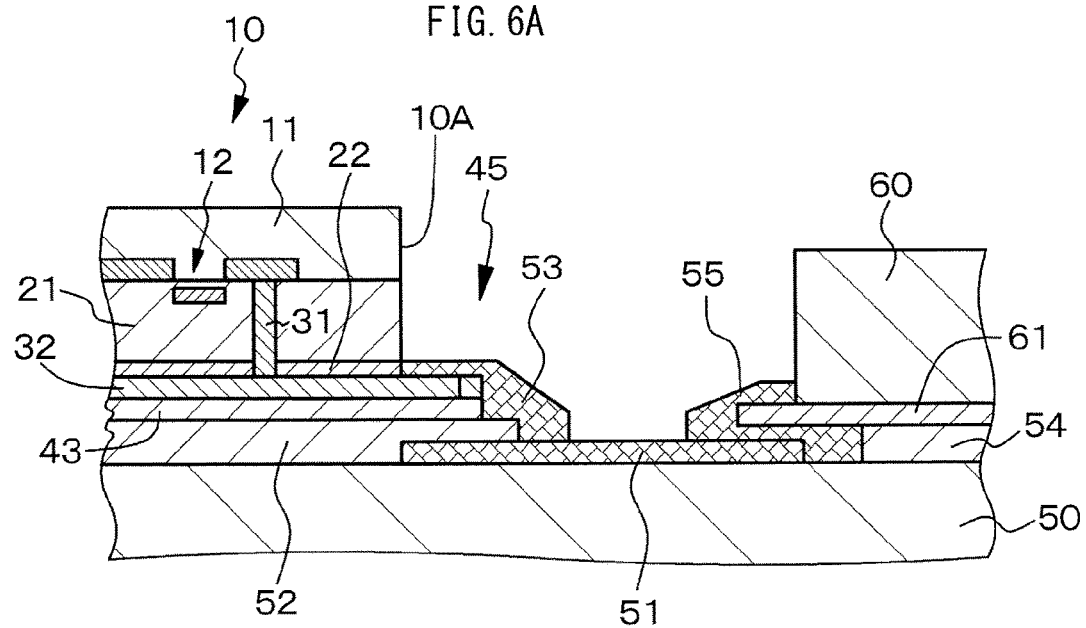

An undepicted relay substrate, on which an adhesive layer (a tacking layer) is provided over the entire surface thereof, is prepared. The top face 11A of the substrate 11 is allowed to come into contact with the adhesive layer to allow the top face 11A of the substrate 11 to adhere to the adhesive layer. Subsequently, the adhesive layer 43 is irradiated with an excimer laser from a support substrate 40 side to induce laser ablation, and the support substrate 40 is removed from the stacked structure 10 at an interface between the adhesive layer 43 and the support substrate 40, and the stacked structure 10 is held by the relay substrate. Subsequently, the stacked structure 10 held by the relay substrate is disposed on a mounting substrate (for example, a printed circuit board) 50, and the relay substrate is removed by a known process, and then a wiring section 51 provided on the mounting substrate 50 is electrically connected to the end portion of the wiring 32. Specifically, the stacked structure 10 is disposed on an uncured adhesive material layer on the mounting substrate 50 such that a projected image of the wiring 32 partially overlaps a projected image of the wiring section 51, and then the relay substrate is removed, and then the uncured adhesive material layer is cured, and then the end portion of the wiring 32 is electrically connected to the wiring section 51. Thus, as illustrated in FIG. 6B, a structure including the stacked structure (semiconductor unit) 10 attached to the mounting substrate 50 is produced. In FIG. 6B, reference numeral 52 represents a photo-curing adhesive material layer for fixation of the stacked structure 10 to the mounting substrate 50, and reference numeral 53 represents the plating layer that electrically connects the end portion of the wiring 32, which serves as the connection terminal section, to the wiring section 51. The second element (specifically, a light emitting element, for example, a light emitting diode, LED) 60 is fixed to the mounting substrate 50 by a photo-curing adhesive material layer 54. The wiring section 51 is electrically connected by the plating layer 55 to the bonding pad section 61 provided on the second element 60. The second element 60 is fixed to the mounting substrate 50 by a known transfer process.

In this way, a mounting board is produced, the mounting board including the stacked structure 10 of Example 1 mounted on the mounting substrate 50 having the wiring section 51 thereon. In addition, an electronic device including the stacked structure 10 of Example 1 is produced. The second element 60 is driven by the element (transistor) 12 connected thereto via the wiring section 51. Specifically, in such a configuration, one light emitting element is driven by one semiconductor unit. It is to be noted that the wiring section 51 is also connected to an undepicted peripheral circuit and/or an undepicted power supply.

Alternatively, the electronic device includes
the stacked structure 10 of Example 1, and
the mounting substrate 50 having the wiring section 51 thereon,
in which the lower surface of the stacked structure 10 is bonded to the mounting substrate 50 with the adhesive material layer (for example, a photo-curing adhesive material layer 52), and
the end portion of the wiring 32 in the stacked structure 10 is electrically connected to the wiring section 51 provided in the mounting substrate 50 via the plating layer 53.

Alternatively, the electronic device includes
the stacked structure 10 of Example 1, and
the mounting substrate 50 having the wiring section 51 thereon,
in which the lower surface of the stacked structure 10 is bonded to the mounting substrate 50 with the adhesive material layer (for example, a photo-curing adhesive material layer 52),
the end portion of the wiring 32 of the stacked structure 10 is electrically connected to the wiring section 51 provided on the mounting substrate 50 via the plating layer 53,
in the stacked structure 10, the substrate 11 is configured of a semiconductor substrate, the substrate 11 has the first element 12 therein, and the first element 12 is electrically connected to the wiring 32 via the connection section 31 provided through the insulating layer 21 and the protective layer 22,
the second element 60 is disposed adjacently to the stacked structure 10 on the mounting substrate 50,
the first element 12 is electrically connected to the second element 60 with the wiring section 51 provided on the mounting substrate 50 (specifically, electrically connected with the plating layer 53), and
the second element 60 is driven by the first element 12.

In the electronic device,
the plurality of stacked structures 10 and the plurality of second elements 60 are arranged in pairs in a two-dimensional matrix manner,
the first element 12 is configured of a transistor, and
the second element 60 is configured of a light emitting element,
so that an image display unit is configured.

In this way, in the stacked structure of Example 1, or in the method of manufacturing the stacked structure, since the protective layer configured of a material different from a material configuring the insulating layer is provided between the wiring and the insulating layer, when the substrate, the insulating layer, and the protective layer are etched during formation of the trench section (isolation trench), occurrence of damage to the wiring is prevented, and reduction in reliability of the connection terminal section is suppressed. Moreover, since the protective layer configured of the material different from the material configuring the insulating layer is provided between the wiring and the insulating layer, an etching step is stabilized, and etching time is reduced.

In an existing method of manufacturing a semiconductor unit, a protective layer is considered to be formed on a wiring provided above a silicon semiconductor substrate in order to prevent occurrence of damage to the wiring during an etching process. Specifically, the silicon semiconductor substrate, the wiring, and the protective layer are considered to be formed in this order. In contrast, the stacked structure 10 of Example 1 includes the substrate 11, the protective layer 22, and the wiring 32 that are formed in this order, i.e., is different from the existing structure in position of the protective layer 22.

Example 2

Example 2 is a modification of Example 1. As illustrated in a schematic partial end-face diagram of each of FIGS. 7A, 7B, and 7C, in the stacked structure of Example 2, the protective layer 22 is provided on a top face of a portion of the wiring 32 that is located below the insulating layer 21 (conveniently shown to be located above the insulating layer 21 in such drawings).

Figure 7A:
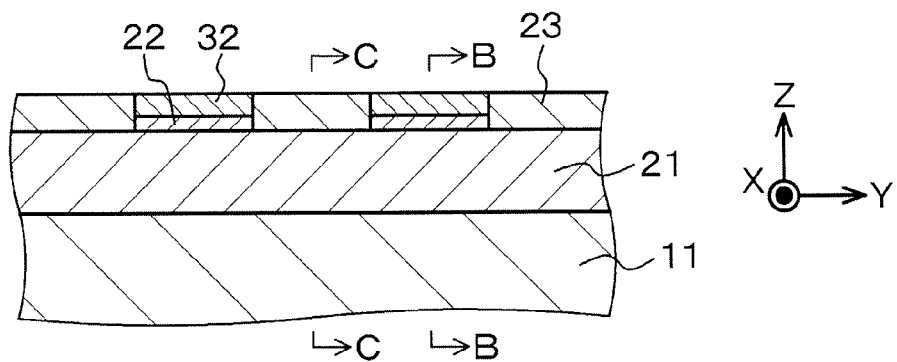
FIGS. 7A, 7B, and 7C are each a schematic partial end-face diagram of a substrate and the like during fabrication of a stacked structure of Example 2.
Figure 7B:
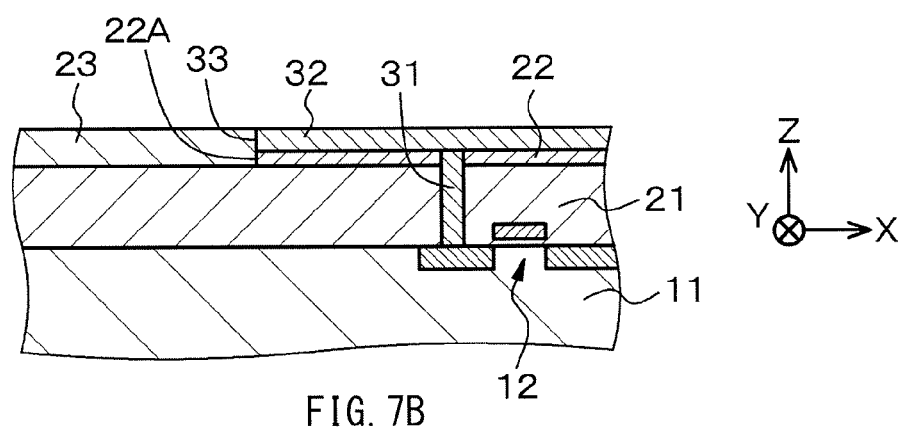
Figure 7C:
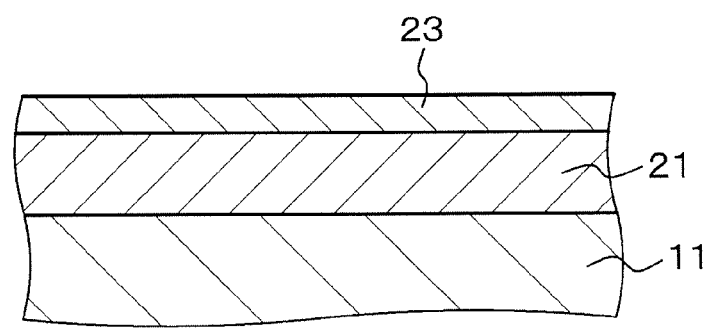
Figure 8A:
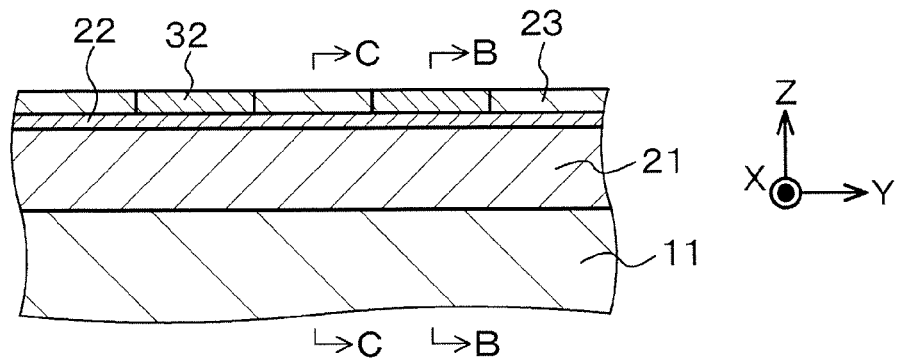
FIGS. 8A, 8B, and 8C are each a schematic partial end-face diagram of a substrate and the like during fabrication of a stacked structure of Example 3.
Figure 8B:
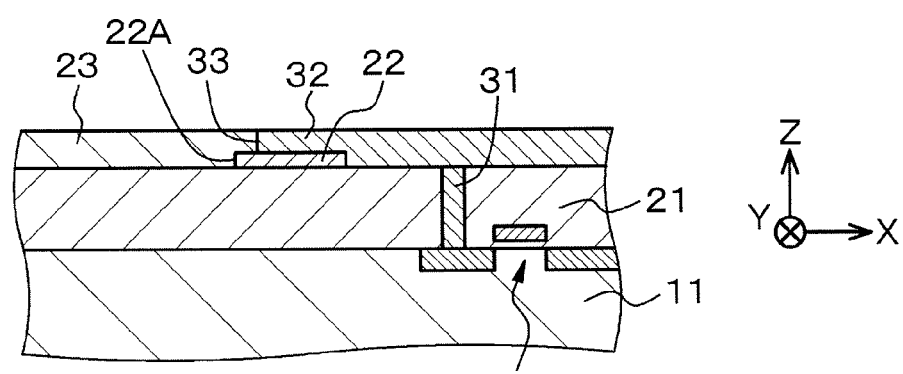
Figure 8C:
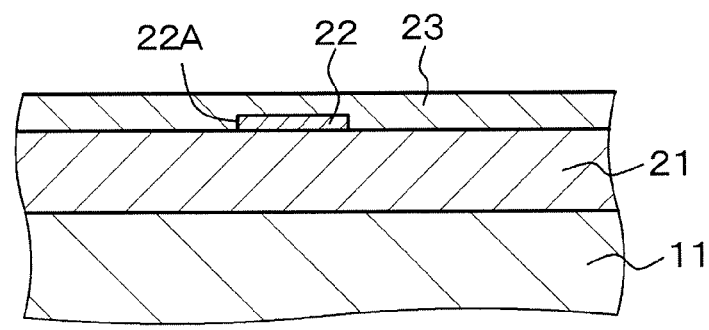
Figure 11A:
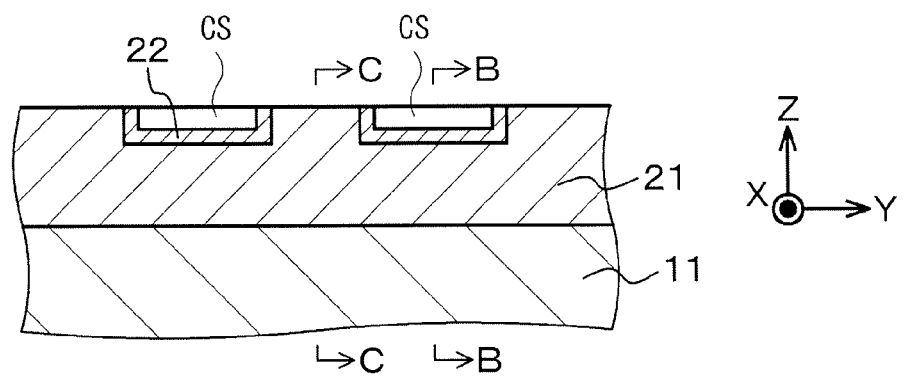
FIGS. 11A, 11B, and 11C are each a schematic partial end-face diagram of a substrate and the like during fabrication of a stacked structure of Example 4.
Figure 11B:
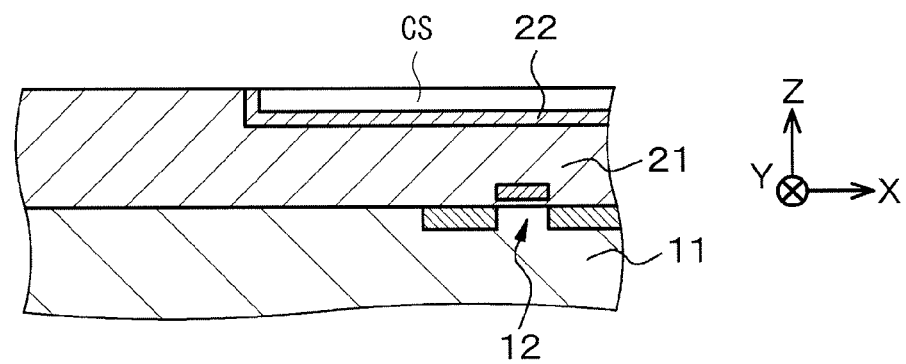
Figure 11C:
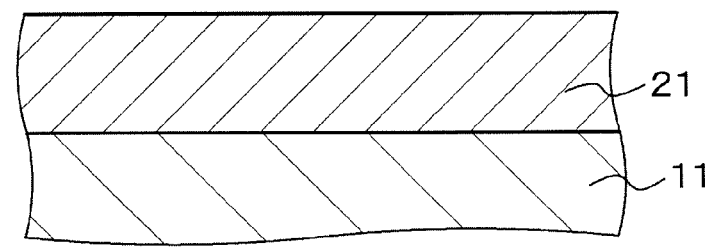
Figure 12A:
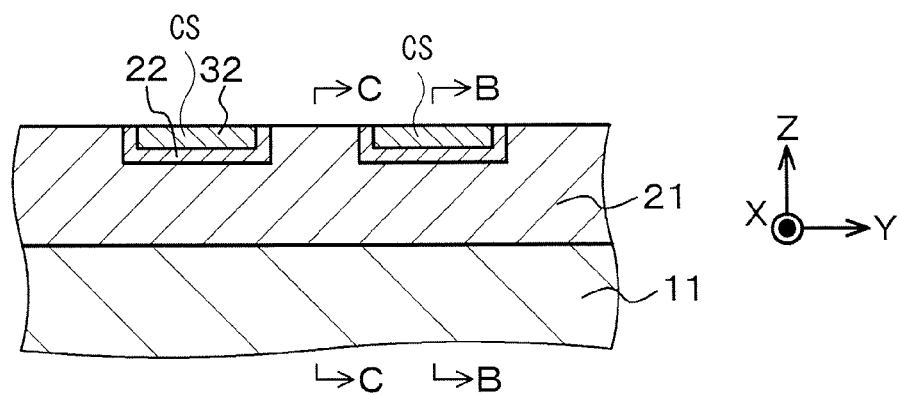
FIGS. 12A, 12B, and 12C are each a schematic partial end-face diagram of the substrate and the like during fabrication of the stacked structure of Example 4, following FIGS. 11A, 11B, and 11C, respectively.
Figure 12B:
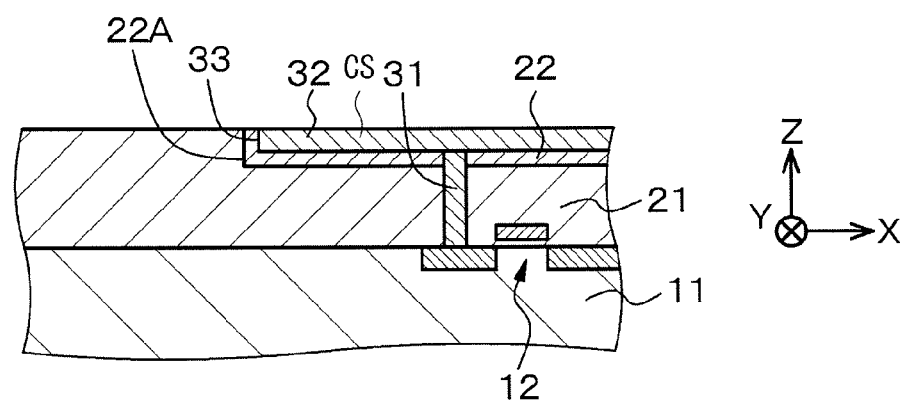
Figure 12C:
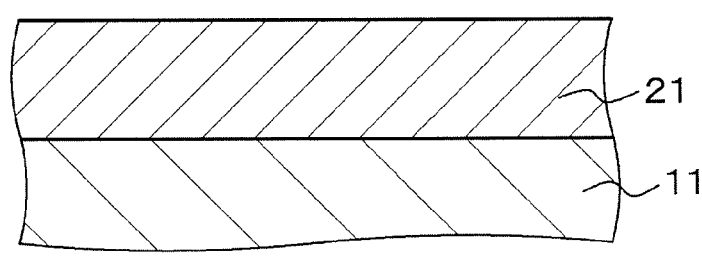

FIG. 7A or each of FIGS. 8A, 9A, 10A, 11A, and 12A described later is a schematic partial end-face diagram (each of FIGS. 7A, 8A, 9A, and 10A) or a partial section diagram (each of FIGS. 11A and 12A) of the substrate and the like that are cut along a plane similar to the YZ plane illustrated in FIG. 1D or the plane along the arrow D-D illustrated in FIGS. 1B and 1C. FIG. 7B or each of FIGS. 8B, 9B, 10B, 11B, and 12B described later is a schematic partial end-face diagram (each of FIGS. 7B, 8B, 9B, and 10B) or a partial section diagram (each of FIGS. 11B and 12B) of the substrate and the like that are cut along a plane similar to the XZ plane illustrated in FIG. 1B or the plane along the arrow B-B illustrated in FIG. 1D. Furthermore, FIG. 7C or each of FIGS. 8C, 10C, 11C, and 12C described later is a schematic partial end-face diagram (each of FIGS. 7C, 8C, and 10C) or a partial section diagram (each of FIGS. 11C and 12C) of the substrate and the like that are cut along a plane similar to the XZ plane or the plane along the arrow C-C illustrated in FIG. 1D.

With the stacked structure of Example 2, in a step similar to step-100 of Example 1, a protective layer 22 configured of a material (specifically, SiN) different from a material configuring the insulating layer 21 is formed based on a CVD process and an etching technique on the insulating layer 21, specifically, on a region of the insulating layer 21, in which the wiring 32 is to be formed.

The configuration, the structure, and the manufacturing method of the stacked structure of Example 2 may be similar to the configuration, the structure, and the manufacturing method of the stacked structure of Example 1, respectively, except for the above-described points, and therefore detailed description of them is omitted. Example 2 may reduce a degree of planarization treatment after formation of the wiring 32 and the like, or may eliminate the planarization treatment in some cases. Use of the structure of Example 2 or the structure of each of Examples 3 and 4 described later makes it possible to reduce floating capacitance or inter-wiring capacitance. The configuration of the protective layer 22 of Example 2 may be applied to each of Examples 5 to 7 described later.

Example 3

Figure 9A:
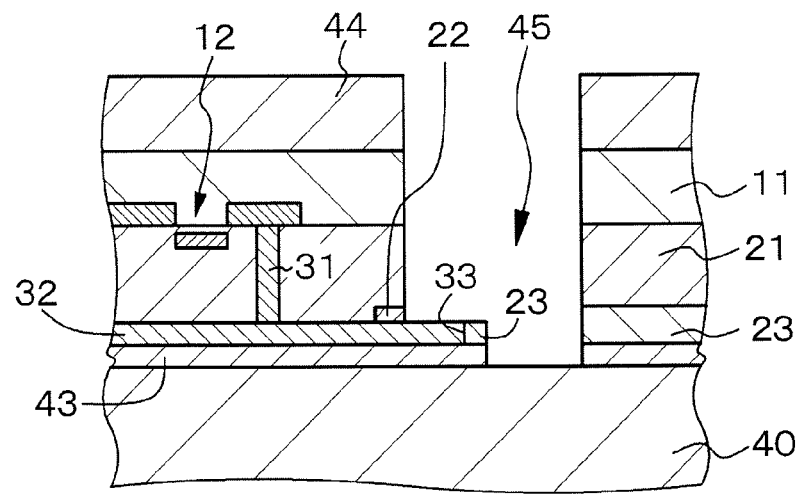
FIGS. 9A and 9B are each a schematic partial end-face diagram of the stacked structure of Example 3.
Figure 9B:
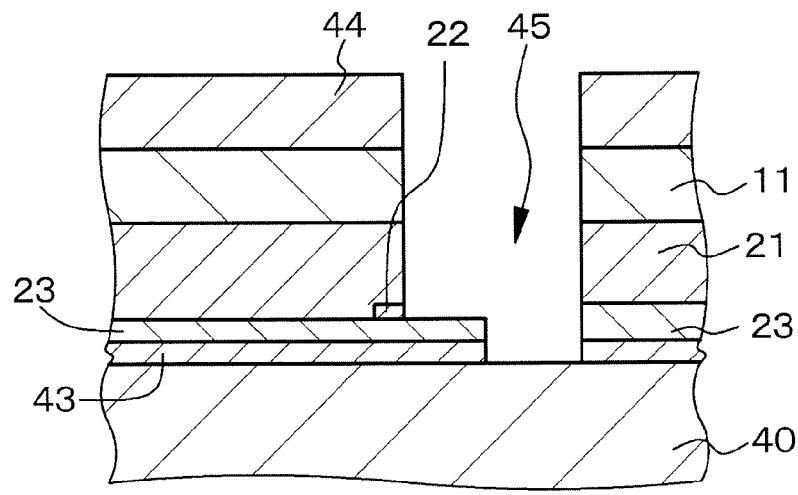

Example 3 is also a modification of Example 1. As illustrated in a schematic partial end-face diagram of each of FIGS. 8A, 8B, 8C, 9A, and 9B, the protective layer 22 is provided on part or all of the top face of the portion of the wiring 32 that is located below the insulating layer 21 (conveniently shown to be located above the insulating layer 21 in FIGS. 8A, 8B, and 8C). Specifically, the protective layer 22 is provided on the end portion of the wiring 32 and a portion of the wiring 32 located in the neighborhood of the trench section 45. FIG. 9A is a schematic partial end-face diagram of the stacked structure that is cut along a virtual plane similar to that in FIG. 1B. FIG. 9B is a schematic partial end-face diagram of the stacked structure that is cut along a virtual plane similar to that in FIG. 1C.

With the stacked structure of Example 3, in a step similar to step-100 of Example 1, a protective layer 22 configured of a material (specifically, SiN) different from a material configuring the insulating layer 21 is formed based on a CVD process and an etching technique on the insulating layer 21, specifically, in Example 3, on a region of the insulating layer 21, in which the end portion of the wiring 32 and the portion of the wiring 32 located in the neighborhood of the trench section 45 are to be formed.

Figure 10A:
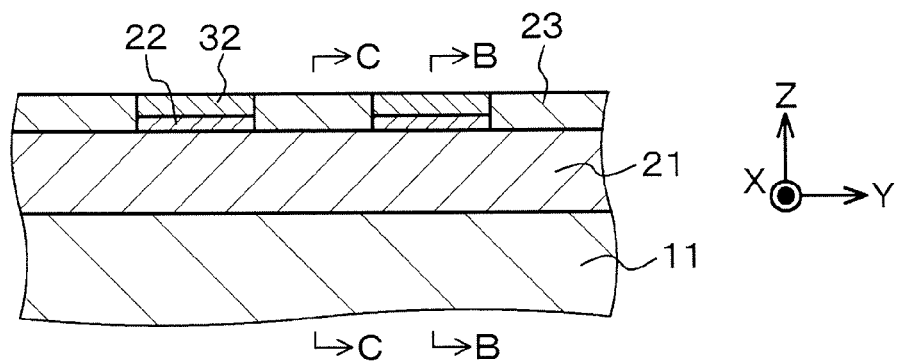
FIGS. 10A, 10B, and 10C are each a schematic partial end-face diagram of a substrate and the like during fabrication of a stacked structure of a modification of the stacked structure of Example 3.
Figure 10B:
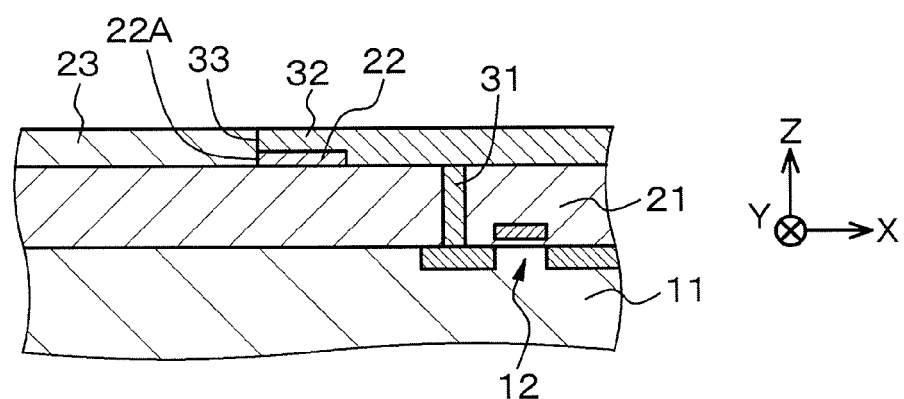
Figure 10C:
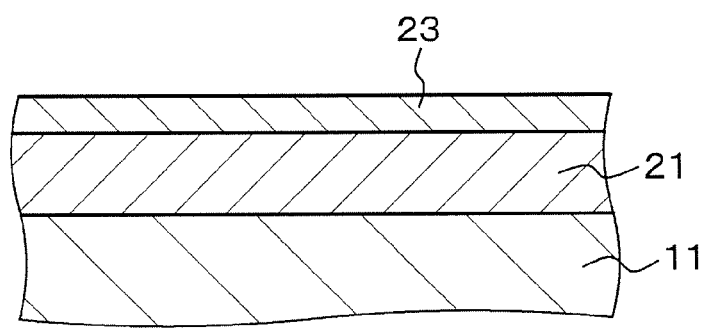

As illustrated in FIGS. 10A, 10B, and 10C, the configuration of the protective layer 22 of Example 3 may be applied to the configuration of the protective layer 22 described in Example 2.

The configuration, the structure, and the manufacturing method of the stacked structure of Example 3 may be similar to the configuration, the structure, and the manufacturing method of the stacked structure of Example 1, respectively, except for the above-described points, and therefore detailed description of them is omitted. The configuration of the protective layer 22 of Example 3 may be applied to each of Examples 5 to 7 described later.

Example 4

Example 4 is also a modification of Example 1. As illustrated in a schematic partial end-face diagram of each of FIGS. 11A, 11B, 11C, 12A, 12B, and 12C, the protective layer 22 is provided on the top face of the portion of the wiring 32 that is located below the insulating layer 21 (conveniently shown to be located above the insulating layer 21 in such drawings), and is further provided from the top face to a side face of the portion of the wiring 32.

With the stacked structure of Example 4, in a step similar to step-100 of Example 1, a concave section CS is formed in the insulating layer 21, specifically, in Example 4, in a region of the insulating layer 21, in which the wiring 32 is to be formed. Subsequently, a protective layer 22 configured of a material (specifically, SiN) different from a material configuring the insulating layer 21 is formed based on a CVD process and a CMP technique on the side face and the bottom face of the concave section CS (see FIGS. 11A, 11B, and 11C). Subsequently, an undepicted barrier metal layer is formed in the concave section CS, and the wiring 32 is formed (see FIGS. 12A, 12B, and 12C). Thus, the wiring 32 having the end face 33 and the connection section 31 are produced based on a so-called dual damascene process.

The configuration, the structure, and the manufacturing method of the stacked structure of Example 4 may be similar to the configuration, the structure, and the manufacturing method of the stacked structure of Example 1, respectively, except for the above-described points, and therefore detailed description of them is omitted. The configuration of the protective layer 22 of Example 4 may be applied to each of Examples 5 to 7 described later.

Example 5

Example 5 is also a modification of Example 1. With the stacked structure of Example 5, as illustrated in a schematic partial end-face diagram of FIG. 14B, a second insulating layer 70 is provided on at least a side face 10A of the stacked structure 10, and a light-shielding film 71 configured of titanium (Ti) is provided on the second insulating layer 70. In Example 5, the second insulating layer 70 is also provided on a top face 10B of the stacked structure 10, and a third insulating layer 72 is provided on the light-shielding film 71. However, such a configuration and a structure are not limitative.

As illustrated in FIG. 6B, the light emitting element 60 is provided adjacently to the stacked structure (semiconductor unit) 10. Hence, light emitted from the light emitting element 60 may enter the stacked structure 10. As a result, the light may have a bad influence (for example, due to photoelectric conversion) on the characteristics of the stacked structure 10. In Example 5, the light-shielding film 71 is provided on a portion of the side face 10A of the stacked structure 10. The light-shielding film 71 is also provided on a portion of the top face 10B of the stacked structure 10. The light emitted from the light emitting element 60 is therefore securely prevented from entering the stacked structure 10, and has less bad influence on the characteristics of the stacked structure (semiconductor unit) 10. Moreover, formation of the third insulating layer 72 makes it possible to prevent occurrence of short circuit between the light-shielding film 71 and the wiring 32 during formation of the plating layer 53 illustrated in FIG. 6B.

A method of manufacturing the stacked structure of Example 5 is now described with reference to FIGS. 13A, 13B, 14A, and 14B. Such drawings are each schematic partial end-face diagram along a plane similar to the XZ plane illustrated in FIG. 1B or a plane along the arrow B-B illustrated in FIG. 1D.

[Step-500]

Figure 13A:
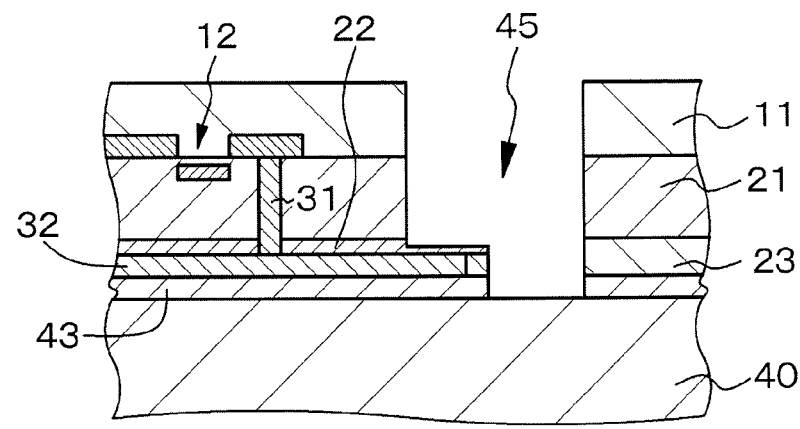
FIGS. 13A and 13B are each a schematic partial end-face diagram of a substrate and the like for explaining a method of manufacturing a stacked structure of Example 5.
Figure 13B:
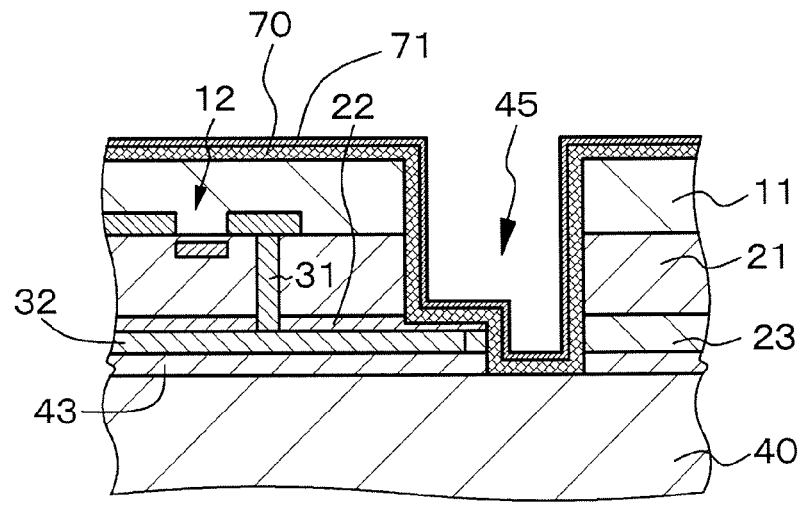

In the method of manufacturing the stacked structure of Example 5, steps similar to steps of Step-100 to Step-140 of Example 1 are performed, and then the etching resist 44 is removed (see FIG. 13A). Thus, the trench section (isolation trench) 45, in which the end portion of the wiring 32 having a surface covered with the protective layer 22 is exposed, is formed.

[Step-510]

Subsequently, the second insulating layer 70 configured of $SiO_2$ is formed based on a known CVD process on the substrate 11 and in the trench section 45. Other examples of materials configuring the second insulating layer 70 may include SiON, SiN, $Al_2O_3$, and $Ta_2O_5$. In addition, a PVD process may also be used as the formation process.

[Step-520]

Subsequently, the light-shielding film 71 is formed on the second insulating layer 70 on at least a sidewall of the trench section 45. In Example 5, the light-shielding film 71 is formed on the second insulating layer 70 on each of the sidewall of the trench section 45 and the substrate 11. Specifically, the light-shielding film 71 configured of Ti is formed based on a known sputtering process on the second insulating layer 70 (see FIG. 13B). Subsequently, a portion of the light-shielding film 71 and a portion of the second insulating layer 70, which are located on a bottom face of the trench section 45 and on an exposed surface of the support substrate 40, are removed based on an etching technique (see FIG. 14A). At this time, since the wiring 32 is covered with the protective layer 22, occurrence of damage to the wiring 32 is also prevented. In addition, the portion of the light-shielding film 71 and the portion of the second insulating layer 70, which are located on the bottom face of the trench section 45 and on the exposed surface of the support substrate 40, are securely removed. A distance L (see FIG. 14A) between a lower end portion of the light-shielding film 71 and the wiring 32 within the trench section 45 is defined by the thickness of the second insulating layer 70 and the thickness of the protective layer 22 in the bottom portion of the trench section 45. Hence, variation in distance L is decreased, and a process is stabilized. As a result, light-shielding performance is improved, and the characteristics of the stacked structure (semiconductor unit) 10 are stabilized. In general, thickness of the portion of the light-shielding film 71 located above each of the bottom face of the trench section 45 and the exposed surface of the support substrate 40 is smaller than thickness of a portion of the light-shielding film 71 located above the substrate 11. Hence, the portion of the light-shielding film 71 and the portion of the second insulating layer 70, which are located on each of the bottom face of the trench section 45 and the exposed surface of the support substrate 40, are allowed to be selectively etched.

[Step-530]

Figure 14A:
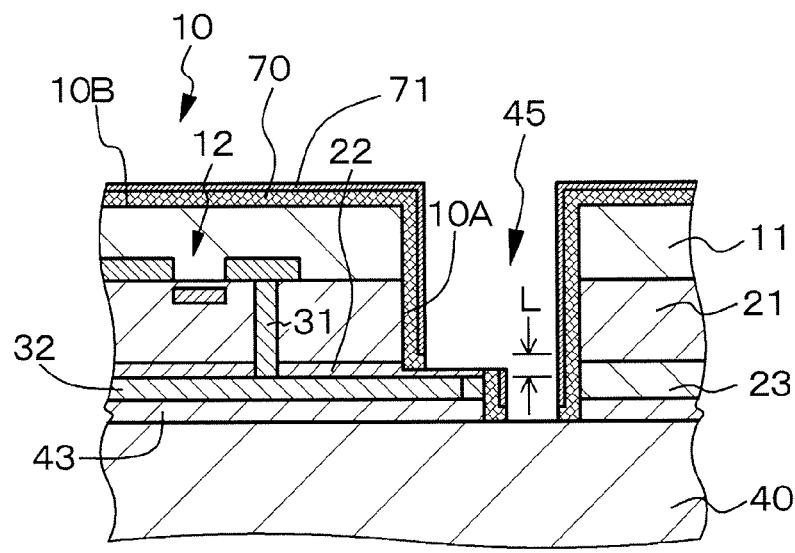
FIGS. 14A and 14B are each a schematic partial end-face diagram of the substrate and the like following FIG. 13B for explaining the method of manufacturing the stacked structure of Example 5.
Figure 14B:
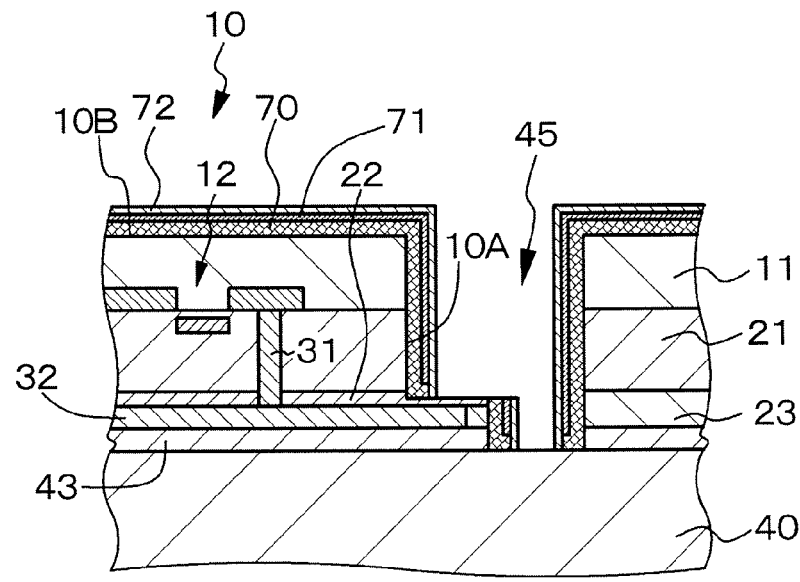

Thus, the light-shielding film 71 is formed. In Example 5, the third insulating layer 72 is then formed on the light-shielding film 71. Specifically, the third insulating layer 72 configured of $SiO_2$ is formed over the entire surface based on a known CVD process, and then the third insulating layer 72 located on each of the bottom face of the trench section 45 and the exposed surface of the support substrate 40 is removed based on an etching technique. In general, thickness of a portion of the third insulating layer 72 located above each of the bottom face of the trench section 45 and the exposed surface of the support substrate 40 is smaller than thickness of a portion of the third insulating layer 72 located above the substrate 11. Hence, the portion of the third insulating layer 72 located on each of the bottom face of the trench section 45 and the exposed surface of the support substrate 40 is allowed to be selectively etched. The second insulating layer 70, the light-shielding film 71, and the third insulating layer 72 are left on the end face 33 of the wiring 32. Thus, the structure illustrated in FIG. 14B is produced. Subsequently, steps similar to Step-150, which removes the protective layer 22 on the wiring 32, and following steps of Example 1 are performed, thereby the stacked structure of Example 5 is produced. The side face 10A of the stacked structure 10 is covered with the second insulating layer 70 and the light-shielding film 71. When the protective layer 22 is removed in a step similar to Step-150 of Example 1, and even if an etching residue exists after etching of the wiring 32, the etching residue is prevented from entering the stacked structure 10 from the side face 10A of the stacked structure 10.

Although the light-shielding film 71 and the third insulating layer 72 are formed after formation of the second insulating layer 70 in Example 5, the light-shielding film 71 and the third insulating layer 72 may not necessarily formed. Only formation of the second insulating layer 70 makes it possible to prevent short circuit between the plating layer 53 and the substrate 11 during formation of the plating layer 53 illustrated in FIG. 6B. The same holds true in the following Example 6.

Example 6

Example 6 is a modification of Example 5. In the stacked structure fabricated in Example 5 in a state as illustrated in FIG. 14B, the second insulating layer 70, the light-shielding film 71, and the third insulating layer 72 remain on the sidewall of the trench section 45 in the neighborhood of the interface between the adhesive layer 43 and the wiring 32 or the like. In a step similar to Step-160 of Example 1, therefore, the support substrate 40 is difficult to be removed from the stacked structure 10 at the interface between the adhesive layer 43 and the support substrate 40. Alternatively, positioning accuracy of the stacked structure 10 is reduced after removal of the support substrate 40. Alternatively, the stacked structure 10 is difficult to be accurately disposed on the mounting substrate 50. As a result, a production yield may be reduced.

Figure 15A:
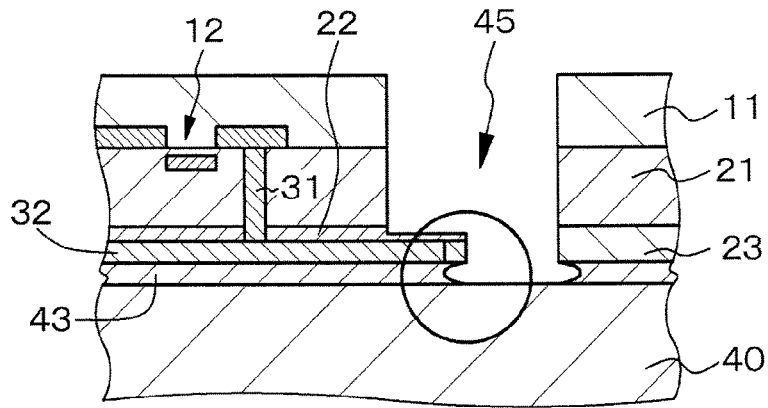
FIGS. 15A and 15B are each a schematic partial end-face diagram of a substrate and the like for explaining a method of manufacturing a stacked structure of Example 6.
Figure 15B:
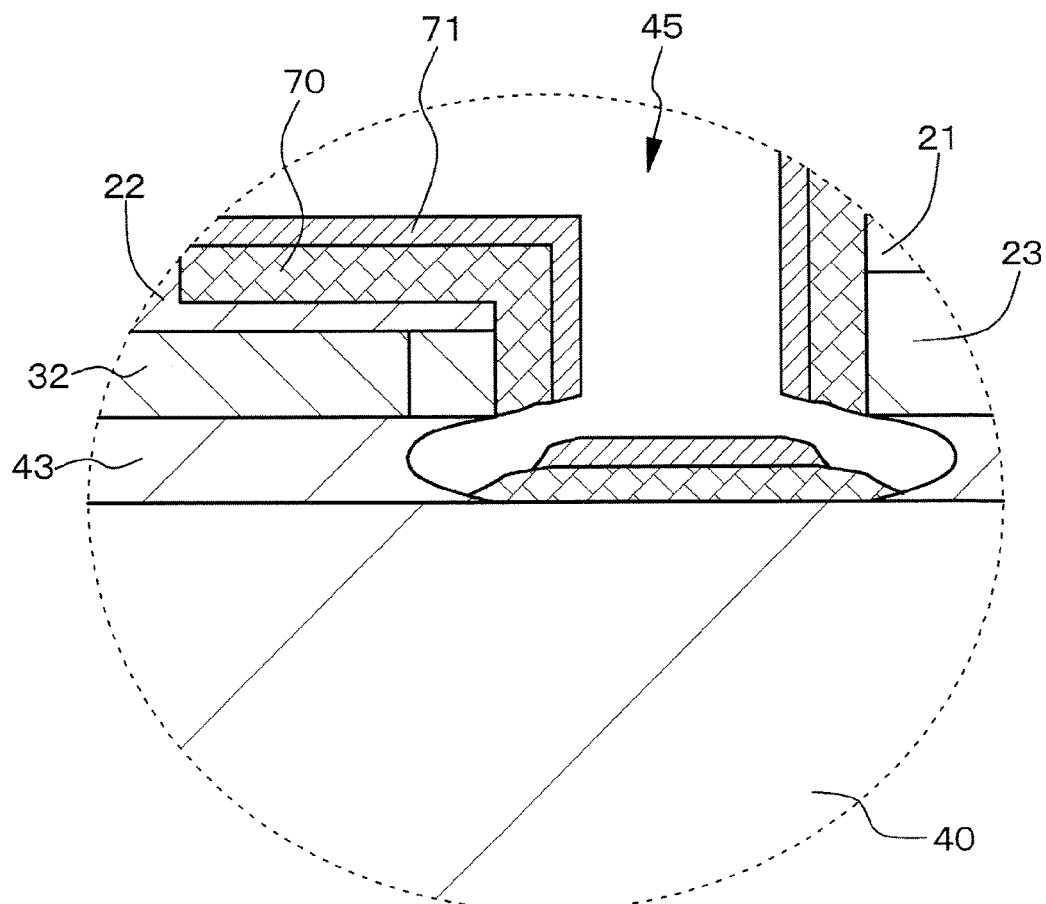

In Example 6, part of the adhesive layer 43 located below the wiring 32 is selectively etched, for example, in an isotropic manner between steps similar to Step-500 and Step-510 of Example 5 (see a schematic partial end-face diagram of FIG. 15A). Subsequently, steps similar to Step-510 and following steps of Example 5 are performed. When the second insulating layer 70 is formed in a step similar to Step-510 of Example 5, since the adhesive layer 43 is removed from the neighborhood of the bottom portion of the trench section 45, a discontinuous portion is formed in the second insulating layer 70. The second insulating layer 70 extends to part of a lower surface of the stacked structure 10. Alternatively, the adhesive layer 43 may be provided on the lower surface of the stacked structure 10, and the second insulating layer 70 may extend to part of the adhesive layer 43. In some cases, the second insulating layer 70 may extend to a lower surface of the end portion of the wiring 32. When the light-shielding film 71 is formed in a step similar to Step-520 of Example 5, a discontinuous portion is also formed in the light-shielding film 71 (see FIG. 15B). When the third insulating layer 72 is formed in a step similar to Step-530, a discontinuous portion is also formed in the third insulating layer 72. The second insulating layer 70, the light-shielding film 71, and the third insulating layer 72 are left on the end face 33 of the wiring 32. FIG. 15B is a schematic partial end-face diagram illustrating the same region as a region enclosed by a circle in FIG. 15A in an enlarged manner. In a step similar to Step-160 of Example 1, therefore, when the support substrate 40 is removed from the stacked structure 10 at the interface between the adhesive layer 43 and the support substrate 40, since the second insulating layer 70 and the like do not exist in the neighborhood of the interface, the support substrate 40 is easily removed from the stacked structure 10. In addition, positioning accuracy of the stacked structure 10 is less reduced after removal of the support substrate 40. In addition, the stacked structure 10 is allowed to be accurately disposed on the mounting substrate 50. As a result, a production yield is less reduced.

Example 7

Figure 19:
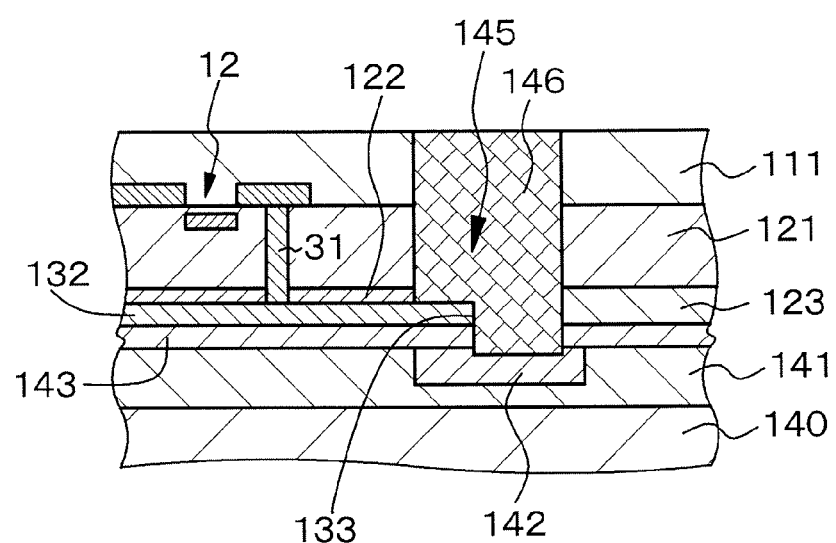
FIG. 19 is a schematic partial end-face diagram of the substrate and the like following FIG. 18B for explaining the method of manufacturing the stacked structure of Example 7.

Example 7 relates to a stacked structure according to the second embodiment of the present disclosure and a method of manufacturing the stacked structure. FIG. 19 illustrates a schematic partial end-face diagram of the stacked structure (semiconductor unit) of Example 7.

The stacked structure of Example 7 includes
a substrate 111 having thereon an insulating layer 121 and a first wiring 132, the first wiring 132 being provided on the insulating layer 121, and
a base 140 having a second wiring 142 thereon.

The substrate 111 is bonded to the base 140 while the first wiring 132 and the second wiring 142 are separated from each other in an opposed manner (specifically, while a projected image of the first wiring 132 partially overlaps a projected image of the second wiring 142), an opening (a hole) 145, in which at least an end face 133 of the first wiring 132 and part of the second wiring 142 are exposed, is provided through the substrate 111 and the insulating layer 121, the opening 145 is filled with a conductive material 146, and a protective layer 122 configured of a material different from a material configuring the insulating layer 121 is provided between the insulating layer 121 and at least a part of the first wiring 132. Part of the first wiring 132, the end face 133 of the first wiring 132, and a part of the second wiring 142 are exposed in the opening 145. A material configuring the protective layer 122 is less likely to be etched compared with a material configuring the insulating layer 121.

Specifically, the protective layer 122 is provided between the insulating layer 121 and at least a part of the first wiring 132, and between at least a part of the first wiring 132 and a part of the first wiring 132. More specifically, in Example 7, the protective layer 122 is provided between the insulating layer 121 and the first wiring 132, and between the adjacent first wirings 132. An interlayer insulating layer 123 is provided between the adjacent first wirings 132, and the protective layer 122 is provided between the interlayer insulating layer 123 and the insulating layer 121.

As with Example 1, the insulating layer 121 and the interlayer insulating layer 123 may each be configured of a silicon-oxide-based material, more specifically $SiO_2$. The protective layer 122 may be configured of a SiN-based material, more specifically SiN. As with Example 1, the substrate 111 configured of a silicon semiconductor substrate has an element (specifically, a transistor) 12 therein. The element 12 is connected to the first wiring 132 through a connection section 31. For example, the first wiring 132 and the connection section 31 may be configured of copper (Cu). For example, the base 140 may be configured of a silicon semiconductor substrate, and has an undepicted transistor therein and an insulating film 141 thereon. A second wiring 142 is provided in the insulating film 141. For example, the substrate 111 may be bonded to the base 140 with an adhesive layer 143.

Figure 16A:
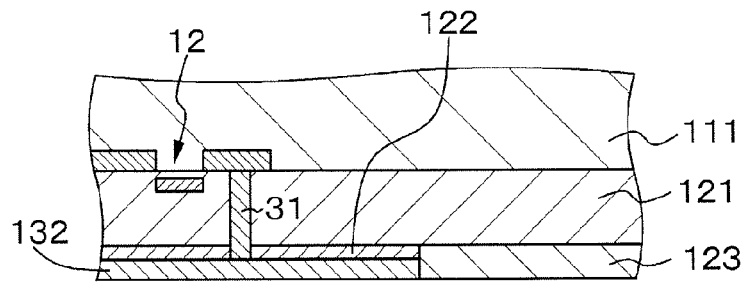
FIGS. 16A and 16B are each a schematic partial end-face diagram of a substrate and the like for explaining a method of manufacturing a stacked structure of Example 7.
Figure 16B:
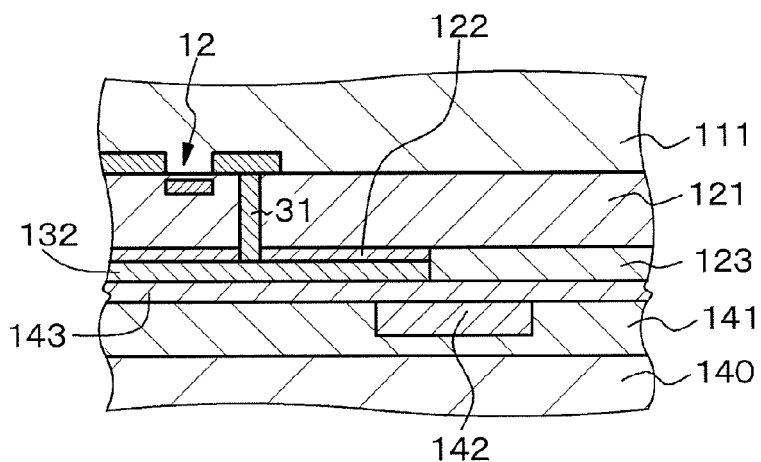
Figure 16C:
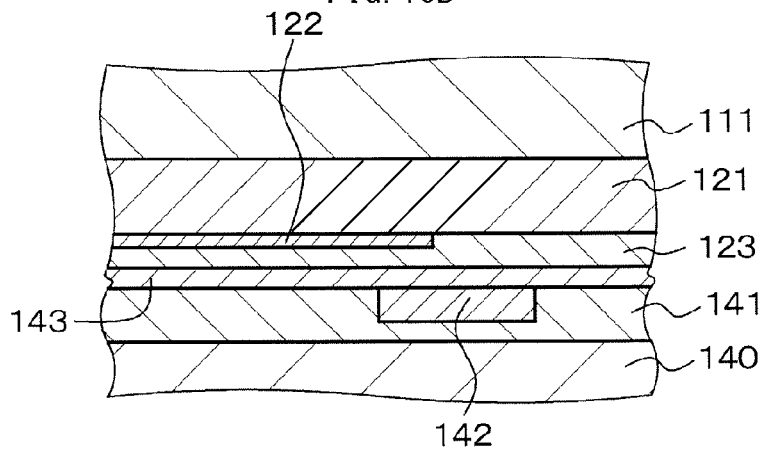
FIG. 16C is a schematic partial end-face diagram of the substrate and the like that are cut along a virtual vertical plane different from that in FIG. 16B.

A method of manufacturing the stacked structure of Example 7 is now described with reference to FIGS. 16A and 16B, FIGS. 17A and 17B, FIGS. 18A and 18B, and FIG. 19 each being a schematic partial end-face diagram of a substrate and the like (a schematic partial end-face diagram along a plane similar to the XZ plane illustrated in FIG. 1B or the plane along the arrow B-B illustrated in FIG. 1D). FIG. 16C is a schematic partial end-face diagram of the substrate and the like that are cut along a virtual vertical plane different from that in FIG. 16B (along a plane parallel to the XZ plane or along a plane similar to the plane along the arrow C-C illustrated in FIG. 1D).

The base 140 having the second wiring 142 thereon is beforehand prepared by a known process. On the other hand, the insulating layer 121 is formed on the substrate 111, and then the protective layer 122, which is configured of a material different from a material configuring the insulating layer 121, is formed on part or all of a region, in which at least the first wiring 132 is to be formed, of the insulating layer 121, and then the first wiring 132 having the end face 133 is formed.

[Step-700]

Specifically, first, elements 12 are formed on the substrate 111 configured of a silicon semiconductor substrate as with Step-100 of Example 1. Subsequently, as with Step-100 of Example 1, the insulating layer 121 configured of $SiO_2$ is formed by a known CVD process on the substrate 111 having the elements 12 therein. Subsequently, the protective layer 122 configured of a material (specifically, SiN) different from a material configuring the insulating layer 121 is formed based on a CVD process and an etching technique on the insulating layer 121 (specifically, in Example 7, on a region of the insulating layer 121, in which the first wiring 132 is to be formed, and on a region of the insulating layer 121 located between the adjacent first wirings 132). Subsequently, as with Step-110 of Example 1, the first wirings 132 are formed on the protective layer 122. In addition, a connection section 31 that is to connect the element 12 to the first wiring 132 is formed. In addition, the interlayer insulating layer 123 configured of $SiO_2$ is formed between the adjacent first wirings 132. It is to be noted that the interlayer insulating layer 123 may be formed before formation of the wiring 132 and the like. Alternatively, the interlayer insulating layer 123 may be formed after formation of the wiring 132 and the like. In this way, the structure illustrated in FIG. 16A is produced. In FIG. 16A, the structure is shown upside down.

[Step-710]

Subsequently, the substrate 111 is bonded to the base 140 while the second wiring 142 and the first wiring 132 are separated from each other in an opposed manner (specifically, while the projected image of the first wiring 132 partially overlaps the projected image of the second wiring 142). Specifically, the substrate 111 is bonded to the base 140 with the adhesive layer 143 by a known process (see FIGS. 16B and 16C).

[Step-720]

Figure 17A:
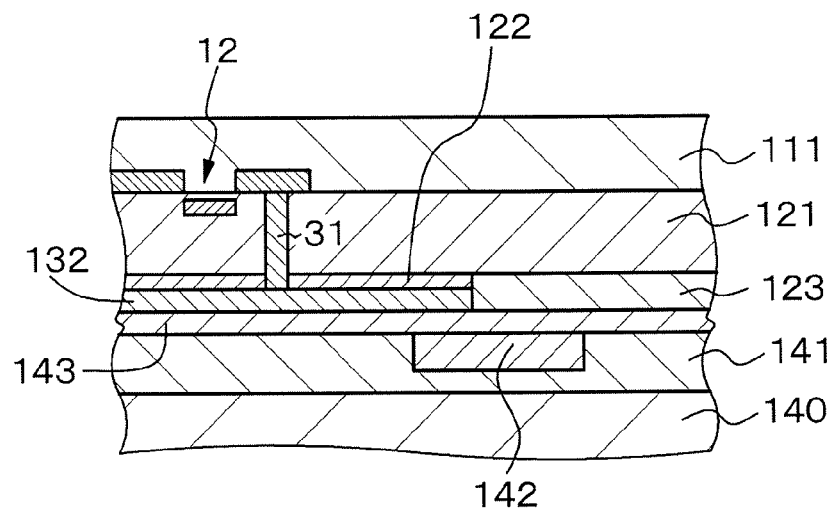
FIGS. 17A and 17B are each a schematic partial end-face diagram of the substrate and the like following FIG. 16B for explaining the method of manufacturing the stacked structure of Example 7.
Figure 17B:
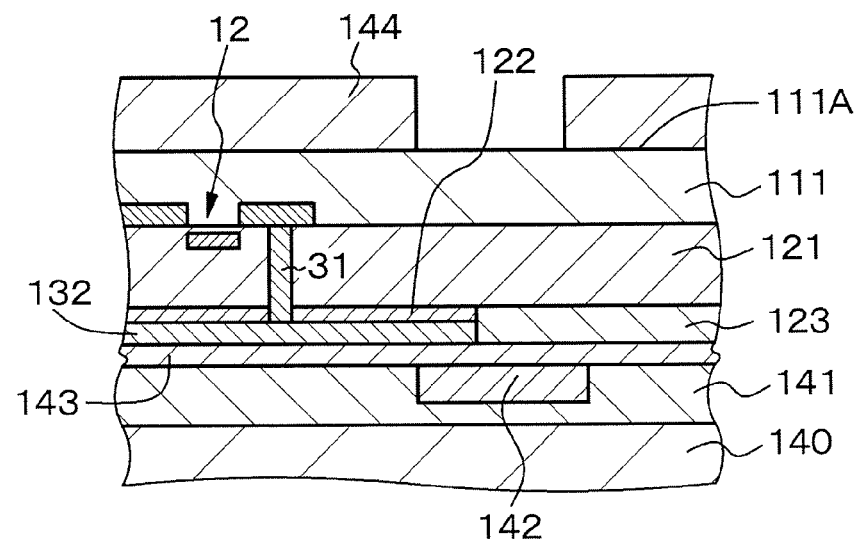

Subsequently, thickness of the substrate 111 may be decreased to, for example, about 10 μm by, for example, a CMP process (see FIG. 17A).

[Step-730]

Figure 18A:
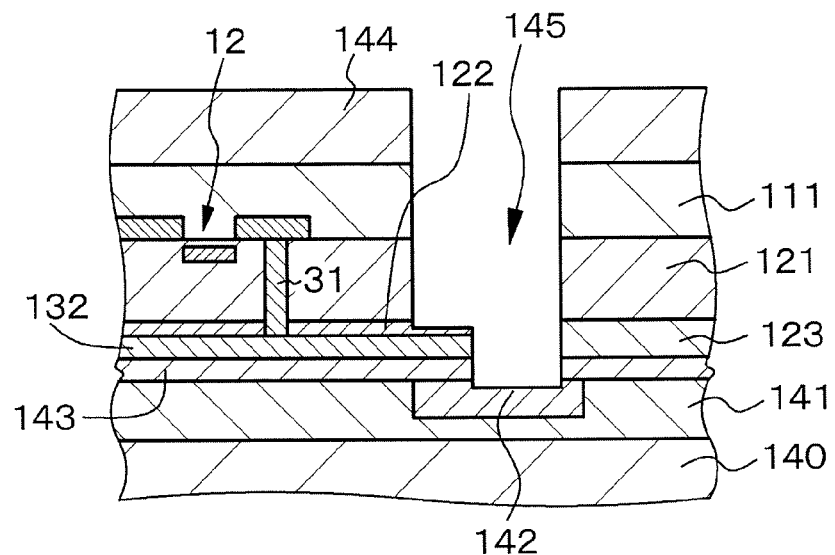
FIGS. 18A and 18B are each a schematic partial end-face diagram of the substrate and the like following FIG. 17B for explaining the method of manufacturing the stacked structure of Example 7.

Subsequently, the substrate 111 and the insulating layer 121 are etched to form an opening (a hole) 145 in which part of the second wiring 142 and at least the end face 133 of the first wiring 132 are exposed. Specifically, a layer of an etching resist 144 is formed by a known process on a top face 111A of the substrate 111 (see FIG. 17B). Subsequently, the substrate 111, the insulating layer 121, and the interlayer insulating layer 123 are etched (see FIG. 18A). At this time, an etching condition is selected such that the insulating layer 121 and the interlayer insulating layer 123 are etched while the protective layer 122 is not etched. Furthermore, when the opening 145 is formed, the connection section of the substrate 111 and the base 140 is etched. Specifically, since the substrate 111 is bonded to the base 140 with the adhesive layer 143, part of the adhesive layer 143 is etched. Thus, the opening (hole) 145 is formed, in which part of the second wiring 142 and at least the end face 133 of the first wiring 132 (specifically, part of the second wiring 142, part of the first wiring 132, and the end face 133 of the first wiring 132) are exposed. Part of the first wiring 132 exposed in the opening 145 has a surface covered with the protective layer 122. In this case, as illustrated in FIG. 18A, the protective layer 122 may be slightly etched. However, since the material configuring the protective layer 122 is less likely to be etched than the material configuring the insulating layer 121, and since the first wiring 132 is covered with the protective layer 122, occurrence of damage, etc. to the first wiring 132 is prevented. If the second wiring 142 is formed thick, occurrence of significant damage, etc. to the second wiring 142 is prevented. A protective layer configured of the same material as that of the protective layer 122 may be provided on at least a surface of a portion of the second wiring 142 located on the bottom portion of the opening 145.

[Step-740]

Figure 18B:
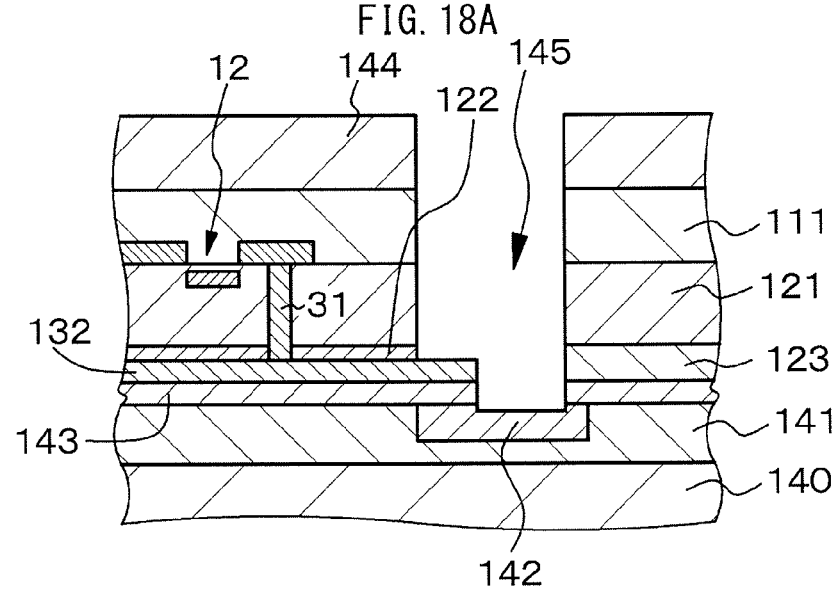

Subsequently, an etching condition is varied so that the protective layer 122 exposed in the opening 145 is removed to expose a surface of part of the first wiring 132 (see FIG. 18B). It is to be noted that the protective layer 122 may not be necessarily removed. If the end face 133 of the first wiring 132 is exposed, the first wiring 132 is brought into conduction with the conductive material 146. Subsequently, the etching resist 144 is removed.

[Step-750]

Subsequently, the opening 145 is filled with the conductive material 146 based on a known process (see FIG. 19).

In the stacked structure of Example 7 or the method of manufacturing the stacked structure, since the protective layer configured of a material different from a material configuring the insulating layer is provided between the insulating layer and the first wiring, when the through chip via is formed through etching of the substrate, the insulating layer, and the protective layer, occurrence of damage to the first wiring is prevented, and reduction in reliability of connection between the first and second wirings is suppressed. Moreover, since the protective layer configured of the material different from the material configuring the insulating layer is provided between the first wiring and the insulating layer, an etching step is stabilized, and etching time is reduced.

In the typical through chip via (TCV) technique, a protective layer is considered to be formed on a wiring provided above a silicon semiconductor substrate in order to prevent occurrence of damage to the wiring during an etching process. Specifically, the silicon semiconductor substrate, the substrate, and the protective layer are considered to be formed in this order. In contrast, the stacked structure of Example 7 includes the substrate 111, the protective layer 122, and the wiring 132 that are formed in this order, i.e., is different from the typical TCV technique in position of the protective layer 122.

Although the present disclosure has been described with preferred Examples hereinbefore, the disclosure is not limited thereto. The configuration, the structure, the used materials described in any of Examples are merely for the purposes of illustration, and may be appropriately modified or altered. Although the single-layer wiring is used in any of Examples, this is not limitative, and multilayer wiring such as two-layer wiring, three-layer wiring, and four-layer wiring may be used. In some cases, an insulating layer or a passivation film may be provided so as to cover the stacked structure.

Although the second element is configured of a light emitting element in any of Examples, the electronic device may be made in a mode where the first element is configured of a transistor, and the second element is configured of, for example, a sensor configured to detect visible light, a sensor configured to detect infrared rays, a sensor configured to detect ultraviolet rays, or a sensor configured to detect X-ray, so that a sensor array is configured.

It is possible to achieve at least the following configurations from the above-described example embodiments of the disclosure.

[A01] (Stacked Structure: First Embodiment)
A stacked structure, including
a wiring,
an insulating layer,
a substrate, and
a protective layer,
wherein the wiring, the insulating layer, and the substrate are stacked from a bottom side, and
an end portion of the wiring is projected from a side face of the stacked structure, and the protective layer is provided between the insulating layer and at least a part of the wiring and is configured of a material different from a material configuring the insulating layer.

[A02] The stacked structure according to [A01], wherein the material configuring the protective layer is less likely to be etched than the material configuring the insulating layer.

[A03] The stacked structure according to [A01] or [A02], further including
an element provided in the substrate, and
a connection section provided in the insulating layer, the connection section connecting the element to the wiring,
wherein the substrate is configured of a semiconductor substrate.

[A04] The stacked structure according to any one of [A01] to [A03], wherein the protective layer is provided between the insulating layer and at least a part of the wiring, and between at least a part of the wiring and a part of the wiring.

[A05] The stacked structure according to [A04], further including an interlayer insulating layer provided between the adjacent wirings, wherein the protective layer is provided between the interlayer insulating layer and the insulating layer.

[A06] The stacked structure according to [A05], wherein an end face of the end portion of the wiring is covered with the interlayer insulating layer.

[A07] The stacked structure according to any one of [A01] to [A06], wherein the protective layer is provided on part or all of a top face of a portion of the wiring located below the insulating layer.

[A08] The stacked structure according to any one of [A01] to [A06], wherein the protective layer is provided on a top face of a portion of the wiring located below the insulating layer.

[A09] The stacked structure according to [A08], wherein the protective layer is provided on the top face of the portion of the wiring located below the insulating layer, and is further provided from the top face to a side face of the portion of the wiring.

[A10] The stacked structure according to [A09], wherein an end face of the end portion of the wiring is covered with the protective layer.

[A11] The stacked structure according to any one of [A01] to [A10], wherein an end portion of the wiring serves as a connection terminal section.

[A12] The stacked structure according to any one of [A01] to [A11], further including a second insulating layer provided on at least a side face of the stacked structure.

[A13] The stacked structure according to [A12], wherein the second insulating layer is provided on a top face of the stacked structure.

[A14] The stacked structure according to [A12] or [A13], wherein the second insulating layer extends to part of a lower surface of the stacked structure.

[A15] The stacked structure according to [A12] or [A13], further including an adhesive layer provided on a lower surface of the stacked structure, wherein the second insulating layer extend to part of the adhesive layer.

[A16] The stacked structure according to any one of [A12] to [A16], further including a light-shielding film provided on the second insulating layer.

[A17] The stacked structure according to [A15], further including a third insulating layer provided on the light-shielding film.

[B01] (Second Embodiment: Stacked Structure)

A stacked structure, including a substrate having thereon an insulating layer and a first wiring, the first wiring being provided on the insulating layer, a base having a second wiring thereon, an opening provided through the substrate and the insulating layer, and a protective layer provided between the insulating layer and at least a part of the first wiring, the protective layer being configured of a material different from a material configuring the insulating layer, wherein the substrate is bonded to the base while the first wiring and the second wiring are separated from each other in an opposed manner, and at least an end face of the first wiring and part of the second wiring are exposed in the opening, and the opening is filled with a conductive material.

[B02] The stacked structure according to [B01], wherein the material configuring the protective layer is less likely to be etched than the material configuring the insulating layer.

[B03] The stacked structure according to [B01] or [B02], wherein the protective layer is provided between the insulating layer and at least a part of the first wiring, and between at least a part of the first wiring and a part of the first wiring.

[B04] The stacked structure according to [B03], further including an interlayer insulating layer provided between the adjacent first wirings, wherein the protective layer is provided between the interlayer insulating layer and the insulating layer.

[B05] The stacked structure according to any one of [B01] to [B04], wherein the protective layer is provided on part or all of a top face of a portion of the first wiring located below the insulating layer.

[B06] The stacked structure according to any one of [B01] to [B04], wherein the protective layer is provided on a top face of a portion of the first wiring located below the insulating layer.

[B07] The stacked structure according to [B06], wherein the protective layer is provided on the top face of the portion of the first wiring located below the insulating layer, and is further provided from the top face to a side face of the portion of the first wiring.

[C01] (Method of Manufacturing Stacked Structure: First Embodiment)

A method of manufacturing a stacked structure, including (A) forming an insulating layer on a substrate, and forming a protective layer configured of a material different from a material configuring the insulating layer on part or all of a region, in which at least a wiring is to be formed, of the insulating layer, and then forming the wiring having an end portion, (B) bonding a side having the wiring of the substrate to a support substrate, (C) thinning the substrate, (D) etching the substrate and the insulating layer to form a trench section in which the end portion of the wiring having a surface covered with the protective layer is exposed, and (E) removing the protective layer exposed in the trench section to expose the end portion of the wiring.

[C02] The method of manufacturing the stacked structure according to [C01], wherein (A) contains forming an interlayer insulating layer between the adjacent wirings.

[C03] The method of manufacturing the stacked structure according to [C01] or [C02], wherein, in (A), a concave portion is formed in the region of the insulating layer, in which the wiring is to be formed, and then the protective layer configured of the material different from the material configuring the insulating layer is formed on each of a side face and a bottom face of the concave portion, and then the wiring is formed in the concave portion.

[C04] The method of manufacturing the stacked structure according to any one of [C01] to [C03], wherein, in (D), a connection section of the substrate and the support substrate is etched during formation of the trench section.

[C05] The method of manufacturing the stacked structure according to [C04], wherein part of the substrate is etched.

[C06] The method of manufacturing the stacked structure according to any one of [C01] to [C03], wherein a side having the wiring of the substrate is bonded to the support substrate with an adhesive layer in (B).

[C07] The method of manufacturing the stacked structure according to [C06], wherein part of the adhesive layer is etched during formation of the trench section in (D).

[C08] The method of manufacturing the stacked structure according to any one of [C01] to [C07], wherein part of the adhesive layer located below the wiring is etched during formation of the trench section in (D), and a second insulating layer is formed on the substrate and in the trench section, between (D) and (E).

[C09] The method of manufacturing the stacked structure according to [C08], wherein, after forming the second insulating layer on the substrate and in the trench section, a light-shielding film is formed on the second insulating layer on at least a sidewall of the trench section.

[C10] The method of manufacturing the stacked structure according to [C09], wherein the light-shielding film is formed on the second insulating layer on each of the sidewall of the trench section and the substrate.

[C11] The method of manufacturing the stacked structure according to [C09] or [C10], wherein, after forming the light-shielding film, a third insulating layer is formed on the light-shielding film.

[C12] The method of manufacturing the stacked structure according to any one of [C01] to [C11], wherein the material configuring the protective layer is less likely to be etched than the material configuring the insulating layer.

[C13] The method of manufacturing the stacked structure according to any one of [C01] to [C12], wherein the end portion of the wiring serves as a connection terminal section.

[D01] A method of manufacturing a stacked structure, including preparing a base having a second wiring thereon, (A) forming an insulating layer on a substrate, and forming a protective layer configured of a material different from a material configuring the insulating layer on part or all of a region, in which at least a first wiring is to be formed, of the insulating layer, and then forming the first wiring having an end face, (B) bonding the substrate to the base while the first wiring and the second wiring are separated from each other in an opposed manner, (C) thinning the substrate, (D) etching the substrate and the insulating layer to form an opening in which part of the second wiring and at least the end face of the first wiring are exposed, and (E) filling the opening with a conductive material.

[D02] The method of manufacturing the stacked structure according to [D01], wherein the material configuring the protective layer is less likely to be etched than the material configuring the insulating layer.

[D03] The method of manufacturing the stacked structure according to [D01] or [D02], wherein (A) contains forming an interlayer insulating layer between the adjacent first wirings.

[D04] The method of manufacturing the stacked structure according to any one of [D01] to [D03], wherein, in (A), a concave portion is formed in the region of the insulating layer, in which the first wiring is to be formed, and then the protective layer configured of the material different from the material configuring the insulating layer is formed on each of a side face and a bottom face of the concave portion, and then the first wiring is formed in the concave portion.

[D05] The method of manufacturing the stacked structure according to any one of [D01] to [D04], wherein, in (D), a connection section of the substrate and the support substrate is etched during formation of the opening.

[D06] The method of manufacturing the stacked structure according to any one of [D01] to [D05], wherein the substrate is bonded to the base with an adhesive layer in (B).

[D07] The method of manufacturing the stacked structure according to [D06], wherein part of the adhesive layer is etched during formation of the opening in (D).

[E01] (Mounting Board: First Embodiment)
A mounting board including the stacked structure according to any one of [A01] to [A17].

[E02] The mounting board according to [E01], further including a mounting substrate having a wiring section thereon, wherein the stacked structure is mounted on the mounting substrate, and the wiring is electrically connected to the wiring section.

[E03] (Mounting Board: Second Embodiment)
A mounting board including
the stacked structure according to any one of [A01] to [A17], and
a mounting substrate having a wiring section thereon,
in which a lower surface of the stacked structure is bonded to the mounting substrate with an adhesive material layer, and
the end portion of the wiring in the stacked structure is electrically connected to the wiring section provided in the mounting substrate with a plating layer.

[F01] (Electronic Device: First Embodiment)
An electronic device including the stacked structure according to any one of [A01] to [A17].

[F02] (Electronic Device: Second Embodiment)
An electronic device including
the stacked structure according to any one of [A01] to [A17], and
a mounting substrate having a wiring section thereon,
in which a lower surface of the stacked structure is bonded to the mounting substrate with an adhesive material layer, and
the end portion of the wiring in the stacked structure is electrically connected to the wiring section provided in the mounting substrate with a plating layer.

[F03] (Electronic Device: Third Embodiment)
An electronic device including
the at least one stacked structure according to any one of [A01] to [A17], and
a mounting substrate having a wiring section thereon,
in which a lower surface of the at least one stacked structure is bonded to the mounting substrate with an adhesive material layer,
the end portion of the wiring in the at least one stacked structure is electrically connected to the wiring section provided on the mounting substrate with a plating layer, the at least one stacked structure includes a substrate configured of a semiconductor substrate having a first element therein, in which the first element is electrically connected to the wiring with a connection section provided in the insulating layer,
at least one second element is disposed on the mounting substrate adjacently to the at least one stacked structure,
the first element is electrically connected to the at least one second element with the wiring section provided on the mounting substrate, and
the at least one second element is driven by the first element.

[F04] The electronic device according to [F03], wherein
the at least one stacked structure includes a plurality of stacked structures,
the at least one second element includes a plurality of second elements,
the plurality of stacked structures and the plurality of second elements are arranged in pairs in a two dimensional matrix manner,
the first element is configured of a transistor, and
the plurality of second elements are configured of light emitting elements,
so that an image display unit is configured.

[F05] The electronic device according to [F03] wherein
the at least one stacked structure includes a plurality of stacked structures,
the at least one second element includes a plurality of second elements,
the first element is configured of a transistor, and
the plurality of second elements are configured of sensors,
so that a sensor array is configured.

It should be understood by those skilled in the art that various modifications, combinations, sub-combinations and alterations may occur depending on design requirements and other factors insofar as they are within the scope of the appended claims or the equivalents thereof.

What is claimed is:
1. A stacked structure, comprising:
a wiring;
a first insulating layer;
a substrate;
an element in the substrate;
a protective layer; and
a connection section in the first insulating layer and the protective layer,
wherein the connection section connects the element to the wiring,
wherein the first insulating layer is stacked on the substrate, the protective layer is stacked on the first insulating layer, and the wiring is stacked on the protective layer,
wherein an end portion of the wiring projects from a side face of the stacked structure,
wherein the protective layer comprises a Silicon Nitride (SiN) based material, and
wherein the protective layer has a first etching rate for an etching condition different from a second etching rate of a material of the first insulating layer.

2. The stacked structure according to claim 1, wherein, the SiN based material of the protective layer etches less than the material of the first insulating layer.

3. The stacked structure according to claim 1, wherein the substrate is a semiconductor substrate.

4. The stacked structure according to claim 1, wherein the protective layer is at least on a part of a face of the wiring, and wherein the face of the wiring faces the first insulating layer.

5. The stacked structure according to claim 1, wherein the end portion of the wiring is a connection terminal section.

6. The stacked structure according to claim 1, further comprising a second insulating layer on at least the side face of the stacked structure that includes the wiring, the first insulating layer, and the substrate.

7. The stacked structure according to claim 6, further comprising a light-shielding film upon the second insulating layer.

8. The stacked structure according to claim 7, further comprising a third insulating layer upon the light-shielding film.

9. A device, comprising:
- a vertically stacked structure that comprises a substrate, an insulating layer, a protective layer, and a first wiring, wherein the insulating layer is stacked on the substrate, the protective layer is stacked on the insulating layer, and the first wiring is stacked on the protective layer;
- an element in the substrate;
- a base that comprises a second wiring;
- an opening that extends through the substrate and the insulating layer; and
- a connection section in the insulating layer and the protective layer,
- wherein the connection section connects the element to the first wiring,
- wherein the protective layer comprises a Silicon Nitride (SiN) based material,
- wherein the protective layer has a first etching rate for an etching condition different from a second etching rate of a material of the insulating layer,
- wherein the substrate is bonded to the base while the first wiring is laterally separated from the second wiring in an opposed manner,
- wherein at least an end face of the first wiring or a part of the second wiring are exposed in the opening, and
- wherein the opening is filled with a conductive material.

10. The device of claim 9, wherein the SiN based material of the protective layer etches less than the material of the insulating layer.

* * * * *